United States Patent [19]

Yama et al.

[11] Patent Number: 5,731,631
[45] Date of Patent: Mar. 24, 1998

[54] SEMICONDUCTOR DEVICE WITH TAPE AUTOMATED BONDING ELEMENT

[75] Inventors: Yomiyuki Yama; Masao Kobayashi; Jun Shibata; Shinji Baba; Masaki Watanabe, all of Tokyo, Japan

[73] Assignee: Mitsubishi Denki Kabushiki Kaisha, Tokyo, Japan

[21] Appl. No.: 681,998

[22] Filed: Jul. 30, 1996

[30] Foreign Application Priority Data

Feb. 1, 1996 [JP] Japan ................. 8-016616

[51] Int. Cl.⁶ .......................................... H01L 23/14
[52] U.S. Cl. ................... 257/702; 257/737; 257/778
[58] Field of Search ........................ 257/778, 702, 257/737, 738, 668

[56] References Cited

U.S. PATENT DOCUMENTS

| | | | |
|---|---|---|---|
| 5,311,059 | 5/1994 | Banerji et al. | 257/778 |
| 5,350,947 | 9/1994 | Takekawa et al. | 257/778 |
| 5,608,262 | 3/1997 | Degani et al. | 257/723 |

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

A semiconductor device having improved heat dissipation property and electrical characteristics and applicable to an integrated circuit having a multiplicity of electrodes, and a method of fabricating the semiconductor device are disclosed. A surface of a semiconductor chip (1) on which a bump (2) is formed is in face to face relation to a surface of a circuit substrate (3) on which a land (5) is formed. A polyimide tape (6) and a TAB lead (7) constitute a TAB tape. The bump (2) and the land (5) are electrically connected to each other through the flat TAB tape. The land (5) is electrically connected to an external connection electrode (4) through an interconnecting line within the circuit substrate (3). The TAB lead (7) extending from the bump (2) to the land (5) is reduced in length, and the signal through the TAB lead (7) accordingly has improved electrical characteristics. The use of the TAB tape permits the semiconductor device to be applied to the semiconductor chip (1) having the multiplicity of bumps (2).

17 Claims, 19 Drawing Sheets

SEMICONDUCTOR DEVICE WITH TAPE AUTOMATED BONDING ELEMENT

BACKGROUND OF THE INVENTION

1. Field of the Invention

The present invention relates to a semiconductor device and a method of fabricating the same. More particularly, the invention relates to a semiconductor device including a package for an integrated circuit which has improved heat dissipation property and electrical characteristics, and a method of fabricating the same.

2. Description of the Background Art

FIG. 35 illustrates a conventional semiconductor device known as an OMPAC (over molded pad array carrier). In FIG. 35, the reference numeral 1 designates a semiconductor chip including an integrated circuit formed on its surface (upper surface in FIG. 35); 3 designates a circuit substrate having a surface connected to the reverse face of the semiconductor chip 1; 4 designates external connection electrodes formed on the reverse face of the circuit substrate 3; 40 designates wires for electrical connection between electrodes (not shown) formed on the surface of the semiconductor chip 1 and the circuit substrate 3; and 8 designates a sealing resin (mold) surrounding the semiconductor chip 1 to protect the semiconductor device. Signal lines (not shown) within the circuit substrate 3 establish electrical connection between the wires 40 and the external connection electrodes 4.

The conventional semiconductor device constructed as above described presents problems to be described below. The use of the wires 40 provides poor electrical characteristics of signals through the wires 40. Additionally, since wire bonding with a small pitch is difficult, the conventional semiconductor device is difficult to apply to the semiconductor chip 1 having a multiplicity of electrodes. Further, the semiconductor chip 1 which generates heat has a poor heat dissipation property.

SUMMARY OF THE INVENTION

According to a first aspect of the present invention, a semiconductor device comprises: a chip having a first electrode formed on a surface thereof; a substrate having a second electrode formed on a surface thereof; and a TAB (tape automated bonding) tape for establishing electrical connection between the first electrode and the second electrode, the surface of the chip being in face to face relation to the surface of the substrate, the TAB tape being provided only between the surface of the chip and the surface of the substrate.

Preferably, according to a second aspect of the present invention, the semiconductor device further comprises: a heat dissipator connected to the chip and made of a material having a good heat dissipation property.

Preferably, according to a third aspect of the present invention, the semiconductor device further comprises: an external electrode formed on a reverse face of the substrate in other than a position immediately under a connecting point of the second electrode and the TAB tape, the external electrode being electrically connected to the second electrode.

Preferably, according to a fourth aspect of the present invention, the semiconductor device further comprises: a component connected to a ground for causing the TAB tape to function as a micro strip line.

Preferably, according to a fifth aspect of the present invention, the semiconductor device further comprises: a signal line formed in the substrate and connected to the second electrode; and a component connected to a ground for causing the second electrode and the signal line to function as micro strip lines.

Preferably, according to a sixth aspect of the present invention, the semiconductor device further comprises: a signal line formed in the substrate and connected to the second electrode; and a component connected to a ground for causing the second electrode and the signal line to function as coplanar strip lines.

Preferably, according to a seventh aspect of the present invention, the component is included in the TAB tape.

Preferably, according to an eighth aspect of the present invention, the component is formed on the surface of the substrate.

Preferably, according to a ninth aspect of the present invention, the semiconductor device further comprises: a signal line formed in the substrate and connected to the second electrode; and a component connected to a ground for causing the second electrode and the signal line to function as micro strip lines or coplanar strip lines, the component being provided between the TAB tape and the signal line.

Preferably, according to a tenth aspect of the present invention, the semiconductor device further comprises a cavity formed in the surface of the substrate under the chip and excavated from the surface of the substrate; a third electrode formed in the cavity; and a fourth electrode formed on the surface of the chip, the third electrode being electrically connected to the fourth electrode.

Preferably, according to an eleventh aspect of the present invention, the semiconductor device further comprises: a third electrode formed on the surface of the substrate under the chip; a fourth electrode formed on the surface of the chip; and an electrically conductive resin for establishing electrical connection between the third electrode and the fourth electrode.

Preferably, according to a twelfth aspect of the present invention, the semiconductor device further comprises: a third electrode formed on the surface of the substrate under the chip, the TAB tape establishing electrical connection between the first electrode and the third electrode.

Preferably, according to a thirteenth aspect of the present invention, the first electrode includes an electrode formed inside the chip and an electrode formed outside the chip; and the second electrode is formed on the surface of the substrate in other than a position under the chip, the electrode formed outside the chip and the second electrode being electrically connected to each other by the TAB tape, the electrode formed inside the chip and the third electrode being electrically connected to each other by the TAB tape.

Preferably, according to a fourteenth aspect of the present invention, the semiconductor device further comprises: a resin in contact with only the chip and the TAB tape for fixing the chip and the TAB tape.

Preferably, according to a fifteenth aspect of the present invention, the semiconductor device further comprises: a through opening extending from the surface of the substrate to a reverse face thereof under the chip; and a resin formed between the substrate and the chip.

According to a sixteenth aspect of the present invention, a semiconductor device comprises: a substrate having a through opening extending from a surface to a reverse face thereof; and a chip placed in the through opening, the chip being in contact with a system for mounting the semiconductor device therein when the semiconductor device is mounted in the system.

Preferably, according to a seventeenth aspect of the present invention, the semiconductor device further comprises: a component made of a thermally conducive material and formed on at least a portion of a contact surface of the chip with the system which has the highest temperature, the component being in contact with the system.

According to an eighteenth aspect of the present invention, a method of fabricating a semiconductor device comprises the steps of: providing a chip having an electrode; providing a TAB tape to connect the electrode to the TAB tape; and forming a resin in contact with the chip and the TAB tape.

According to a nineteenth aspect of the present invention, a method of fabricating a semiconductor device comprises the steps of: providing a chip having an electrode; providing a substrate having a through opening extending from a surface to a reverse face thereof to connect the chip to the substrate, with a space made between the substrate and the chip; and injecting a resin for protecting the semiconductor device from outside into the space through the through opening.

According to a twentieth aspect of the present invention, a method of fabricating a semiconductor device comprises the steps of: providing a chip having an electrode; providing a substrate having a through opening extending from a surface to a reverse face thereof to connect the chip to the substrate, with a space made between the substrate and the chip; and forming a resin for protecting the semiconductor device on the substrate while exhausting air from the space through the through opening.

In accordance with the first aspect of the present invention, the TAB tape extending from the first electrode to the second electrode may be reduced in length, and the signal through the TAB tape accordingly has improved electrical characteristics.

In accordance with the second aspect of the present invention, the semiconductor device has an improved heat dissipation property.

In accordance with the third aspect of the present invention, damages to the substrate when the TAB tape is connected to the second electrode is alleviated.

In accordance with the fourth aspect of the present invention, satisfactory signal transmission is achieved through the TAB tape.

In accordance with the fifth aspect of the present invention, the second electrode and the signal line are caused to function as the micro strip lines to allow satisfactory signal transmission.

In accordance with the sixth aspect of the present invention, the second electrode and the signal line are caused to function as the coplanar strip lines to allow satisfactory signal transmission.

In accordance with the seventh aspect of the present invention, the double-sided TAB tape may be used.

In accordance with the eighth aspect of the present invention, the construction of the semiconductor device is simplified to reduce the costs of the semiconductor device.

In accordance with the ninth aspect of the present invention, the second electrode and the signal line are caused to function as the micro strip lines or coplanar strip lines, and the component is provided between the TAB tape and the signal line. This allows satisfactory signal transmission and suppresses the cross talk between the TAB tape and the second electrode.

In accordance with the tenth aspect of the present invention, the provision of the cavity prevents deviations of the third and fourth electrodes to prevent an open between the third and fourth electrodes. This improves the yield of the semiconductor devices.

In accordance with the eleventh aspect of the present invention, the electrically conductive resin establishes connection between the third and fourth electrodes to prevent an open between the third and fourth electrodes. This improves the yield of the semiconductor devices.

In accordance with the twelfth aspect of the present invention, the provision of the third electrode and the TAB tape under the chip increases the degree of freedom of circuit design within the chip, permitting efficient design of the semiconductor device.

In accordance with the thirteenth aspect of the present invention, the pitch of the arranged TAB tapes is increased, permitting more efficient design of the semiconductor device.

In accordance with the fourteenth aspect of the present invention, the resin fixes the chip and the TAB tape to prevent the TAB lead from being bent when the TAB tape is connected to the chip during the fabrication steps of the semiconductor device, preventing a short of adjacent TAB tapes.

In accordance with the fifteenth aspect of the present invention, the resin is injected into the through opening and air is exhausted through the through opening in the step of sealing the semiconductor device with resin. This suppresses bubbles contained in the resin and a resin unfilled portion, increasing the reliability of the semiconductor device.

In accordance with the sixteenth aspect of the present invention, heat is transferred from the semiconductor device to the system. The semiconductor device has an improved heat dissipation property.

In accordance with the seventeenth aspect of the present invention, heat generated from the semiconductor device may be efficiently dissipated.

In accordance with the eighteenth aspect of the present invention, the incomplete semiconductor device may be easily handled in the step after the formation of the resin. This provides for a highly reliable semiconductor device.

In accordance with the nineteenth aspect of the present invention, resin is injected from inside the semiconductor device to suppress bubbles contained in the resin and a resin unfilled portion. Thus, a highly reliable semiconductor device is provided.

In accordance with the twentieth aspect of the present invention, air is exhausted from inside to outside of the semiconductor device to suppress bubbles contained in the resin and a resin unfilled portion. Thus, a highly reliable semiconductor device is provided.

It is therefore an object of the present invention to provide a semiconductor device having improved heat dissipation property and electrical characteristics and applicable to an integrated circuit having a multiplicity of electrodes, and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
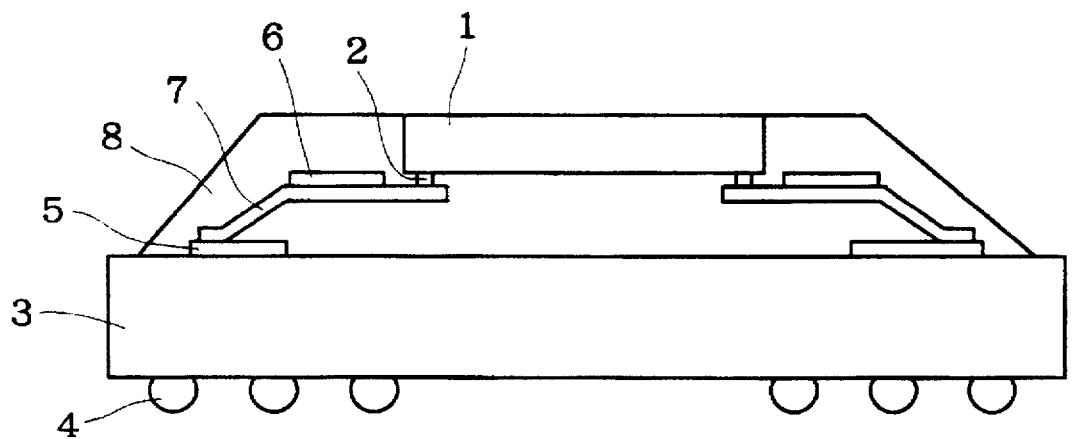
FIG. 1 illustrates a semiconductor device according to a first preferred embodiment of the present invention.

FIG. 1 illustrates a semiconductor device according to a first preferred embodiment of the present invention. In FIG. 1, the reference numeral 1 designates a semiconductor chip made of silicon or the like and having a surface (lower surface in FIG. 1) formed with an integrated circuit; 2 designates bumps serving as protruding electrodes made of gold, solder or the like and formed on the surface of the semiconductor chip 1; 3 designates a circuit substrate made of glass fiber reinforced plastic, FR4 or the like; 4 designates ball-shaped external connection electrodes made of solder or the like and formed on the reverse face of the circuit substrate 3 for mounting a semiconductor device on a system (mounting substrate); 5 designates lands serving as electrodes and formed on the surface of the circuit substrate 3; 6 designates a polyimide tape generally used as a TAB (tape automated bonding) tape; 7 designates TAB leads made of copper or the like and formed on the polyimide tape 6; and 8 designates a sealing resin made of, for example, epoxy for protecting the semiconductor device.

Construction is described below. The polyimide tape 6 and the TAB lead 7 constitute a TAB tape. The bumps 2 and the lands 5 are electrically connected to each other through the TAB leads 7. The lands 5 and the external connection electrodes 4 are electrically connected to each other through signal lines (not shown) formed within the circuit substrate 3.

In particular, the surface of the semiconductor chip 1 and the surface of the circuit substrate 3 are opposed in face to face relation (with the semiconductor chip 1 placed face down). The TAB tape is present only between the surface of the semiconductor chip 1 and the surface of the circuit substrate 3. Thus, the TAB tape maintains its flatness. This reduces the length of the TAB leads 7 from the bumps 2 to the lands 5, and also reduces the thickness of the semiconductor device (the distance from the reverse face of the semiconductor chip 1 to the reverse face of the circuit substrate 3).

A method of fabricating the semiconductor device shown in FIG. 1 is discussed below. First, with reference to FIG. 2, the semiconductor chip 1 with the bumps 2 formed on the surface thereof is prepared.

Figure 3:
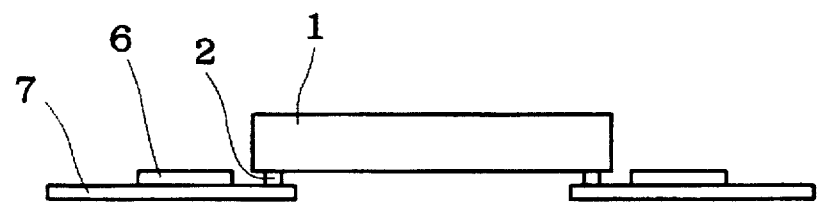

Referring to FIG. 3, the TAB tape is provided, and one end of the TAB lead 7 is connected to the bump 2.

Figure 4:
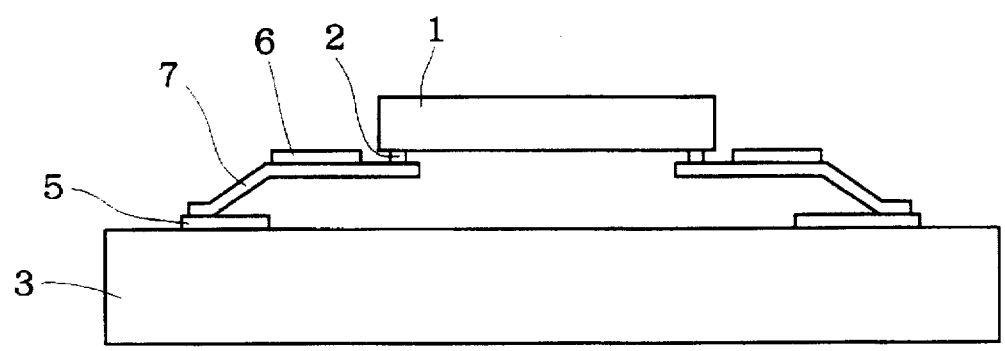

As shown in FIG. 4, the circuit substrate 3 with the lands 5 formed on the surface thereof is provided. The surface of the circuit substrate 3 is opposed to the surface of the semiconductor chip 1. The other end of the TAB lead 7 is connected to the land 5.

Figure 5:
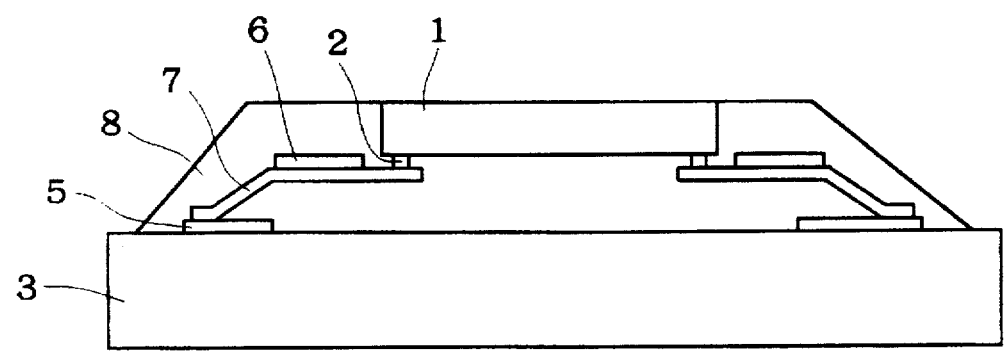

With reference to FIG. 5, the sealing resin 8 is formed over the semiconductor chip 1 and the surface of the circuit substrate 3, with the reverse face of the semiconductor chip 1 exposed. Then, the external connection electrodes 4 are connected to the reverse face of the circuit substrate 3. Then, the semiconductor device shown in FIG. 1 is completed.

In the first preferred embodiment, the TAB leads 7 may establish connection between the bumps 2 and the lands 5 while maintaining their flatness. This requires a short length of the TAB leads 7 from the bumps 2 to the lands 5 to accordingly provide improved electrical characteristics of a signal through the TAB leads 7. The reduced thickness of the semiconductor device provides an improved rigidity of the whole semiconductor device. Thus, for example, if the semiconductor device is mounted in the system, the whole system is reduced in thickness and provides an improved rigidity. Additionally, the use of the TAB tape facilitates the application of the semiconductor device of the present invention to the semiconductor chip 1 having the multiplicity of bumps 2.

Second Preferred Embodiment

Figure 6:
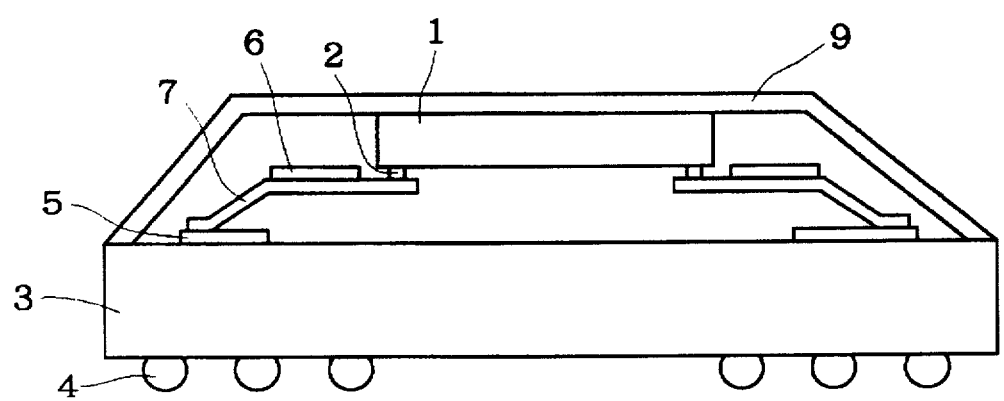
FIG. 6 illustrates the semiconductor device of one form according to a second preferred embodiment of the present invention.

FIG. 6 illustrates the semiconductor device according to a second preferred embodiment of the present invention. In FIG. 6, the reference numeral 9 designates a cap-shaped heat dissipator made of a material having a good heat dissipation property such as aluminum, copper, or the like. Other reference numerals designate parts corresponding to those of FIG. 1.

Construction will be described hereinafter. The heat dissipator 9 is cap-shaped to cover the surface of the circuit substrate 3 including the semiconductor chip 1 and the TAB tape. The heat dissipator 9 contacts the reverse face of the semiconductor chip 1. Other elements of FIG. 6 are similar in construction to those of FIG. 1.

In the second preferred embodiment, the heat dissipator 9 dissipates heat generated by the semiconductor chip 1 to provide a good heat dissipation property of the semiconductor device. The cap-shaped heat dissipator 9 protects the semiconductor device to eliminate the need to form the sealing resin 8. Further, if the heat dissipator 9 is grounded, the electrical characteristics of the semiconductor device are improved.

Figure 7:
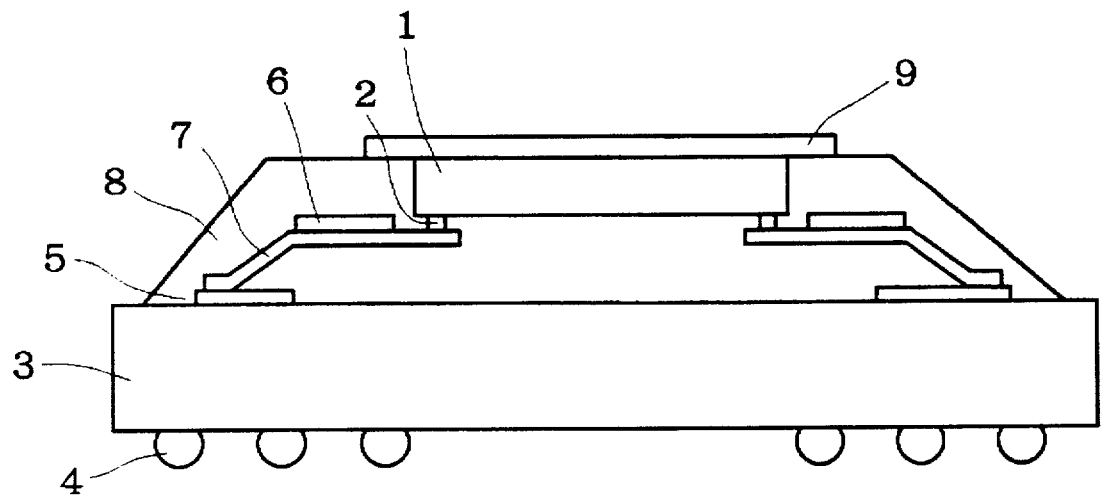
FIG. 7 illustrates the semiconductor device of another form according to the second preferred embodiment of the present invention.
Figure 8:
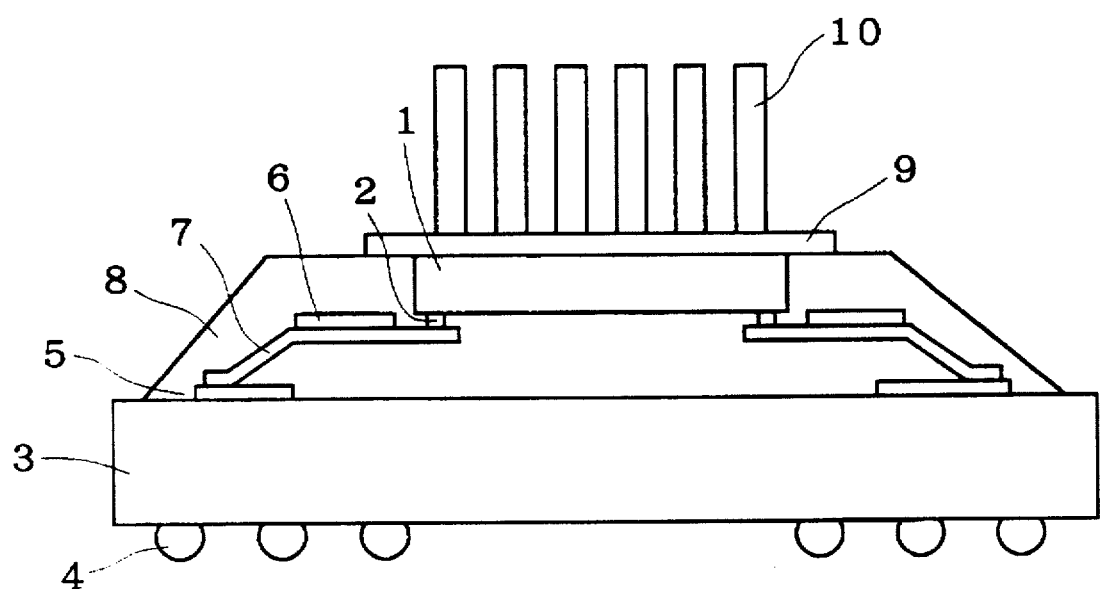
FIG. 8 illustrates the semiconductor device of still another form according to the second preferred embodiment of the present invention.

FIGS. 7 and 8 illustrate variations of the configuration of the heat dissipator 9. The heat dissipator 9 shown in FIG. 7 may have the shape of a flat plate in contact with the reverse face of the semiconductor chip 1. The semiconductor device shown in FIG. 8 is configured such that plate-shaped heat dissipation fins 10 made of a material having a good heat dissipation property such as aluminum, copper, or the like are connected to the upper surface of the heat dissipator 9 of FIG. 7. The heat dissipator 9 and the heat dissipation fins 10 constitute a heat dissipator of FIG. 8. The heat dissipation fins 10 may be connected to the heat dissipator 9 of FIG. 6. In this construction, the heat dissipator 9 and the heat dissipation fins 10 constitute the heat dissipator. The provision of the heat dissipation fins 10 further improves the heat dissipation property.

Third Preferred Embodiment

Figure 9:
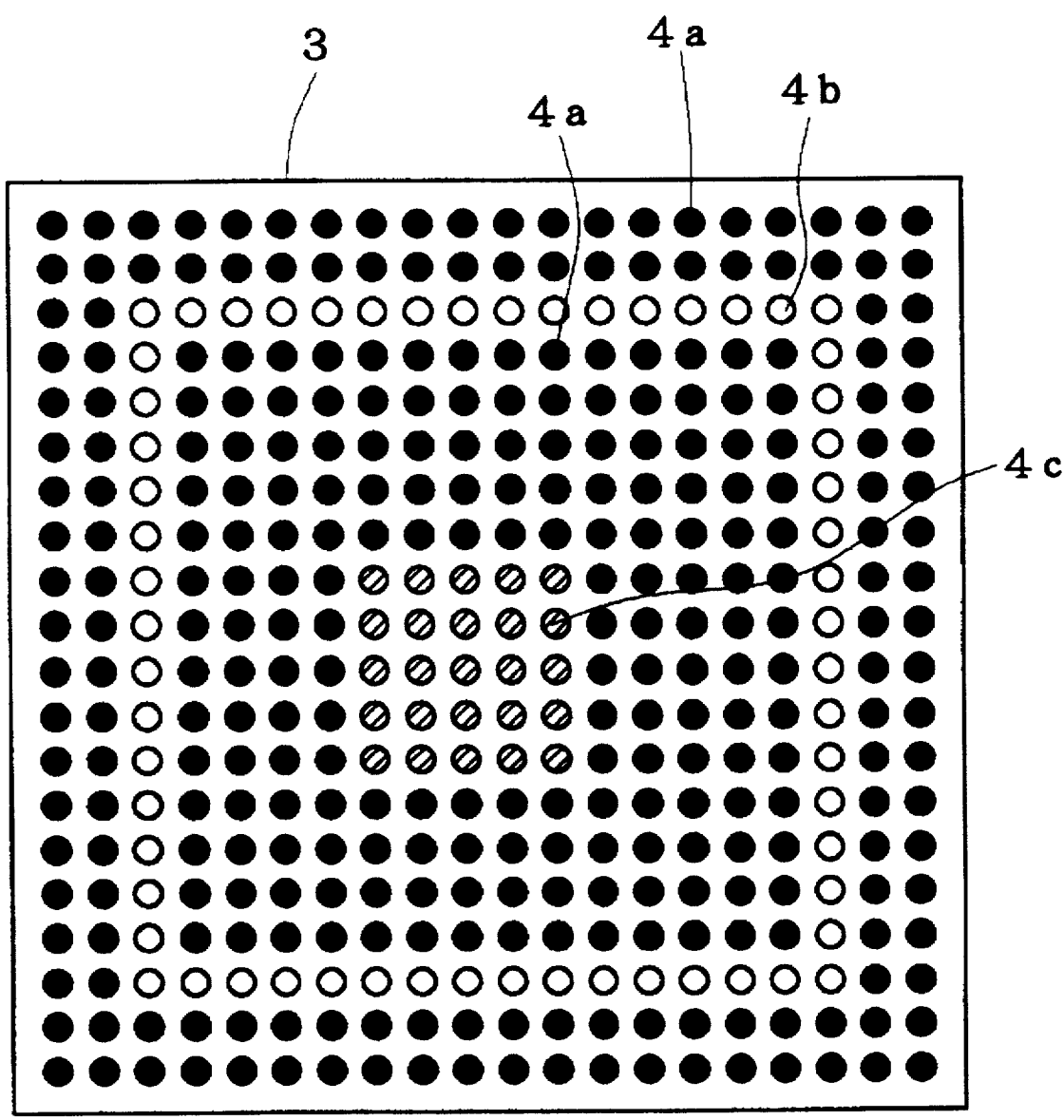
FIG. 9 is a bottom view of the semiconductor device according to a third preferred embodiment of the present invention.

FIG. 9 is a bottom view of the semiconductor device according to a third preferred embodiment of the present invention. In FIG. 9, the reference characters 4a, 4b, 4c designate positions of the external connection electrodes 4 of FIG. 1. Other reference numerals designate parts corresponding to those of FIG. 1.

Construction will be described below. For example, referring to FIG. 1, the third preferred embodiment is designed such that the external connection electrodes 4 are not present immediately under the lands 5 (particularly parts of the lands 5 which are connected to the TAB leads 7).

Conventionally, the semiconductor devices are of two types: a full matrix type and a perimeter type. The full matrix type comprises the external connection electrodes 4 located in all of the positions 4a, 4b, 4c of FIG. 9 (that is, fully on the reverse face of the circuit substrate 3). The perimeter type comprises the external connection electrodes 4 located only in the positions 4a and 4b of FIG. 9 (that is, on perimetric parts of the reverse face of the circuit substrate 3). An example of the number and arrangement of positions 4a, 4b, 4c is illustrated in FIG. 9. The external connection electrodes 4 of such full matrix type and perimeter type which are located in the positions 4b are removed in this preferred embodiment. The positions 4b in which the external connection electrodes 4 are absent are located immediately under the lands 5 of FIG. 1 (particularly the parts of the lands 5 which are connected to the TAB leads 7).

In the third preferred embodiment, the lands 5 are located immediately over the positions 4b in which the external connection electrodes 4 are absent. This alleviates damages to the circuit substrate 3 when the TAB leads 7 are connected to the lands 5 in the step shown in FIG. 4.

The positions 4b are arranged in a line along each side of the circuit substrate 3 in FIG. 9, but may be arranged in two or more lines. The third preferred embodiment is applicable to other preferred embodiments.

Fourth Preferred Embodiment

Figure 10:
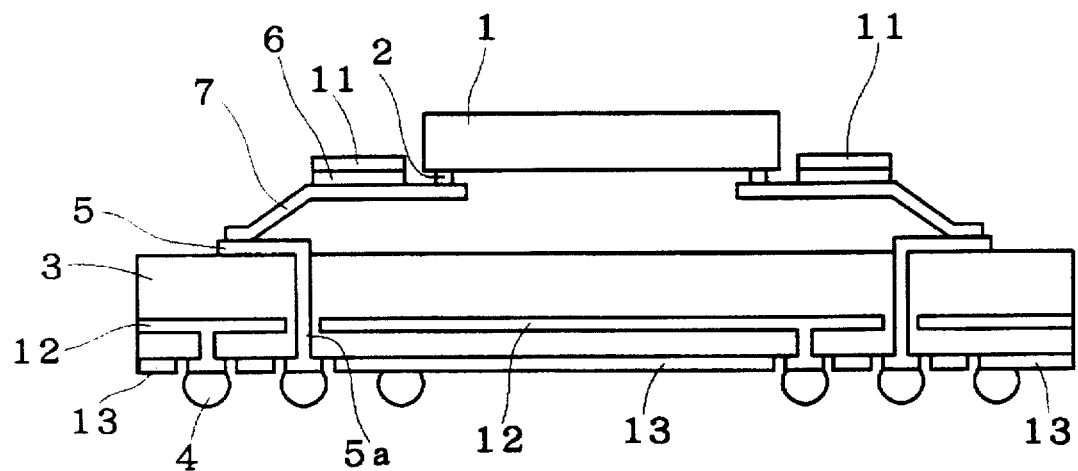
FIG. 10 illustrates the semiconductor device according to a fourth preferred embodiment of the present invention.

FIG. 10 illustrates the semiconductor device according to a fourth preferred embodiment of the present invention. In FIG. 10, the reference character 5a designates signal lines within the circuit substrate 3 for electrically connecting the lands 5 and the external connection electrodes 4 together; 11 and 12 designate ground planes; and 13 designates a power supply plane. Other reference numerals designate parts corresponding to those of FIG. 1.

Construction will be described below. In the fourth preferred embodiment, the TAB tape is a double-sided TAB tape. The polyimide tape 6, the TAB lead 7 and the ground plane 11 constitute the double-sided TAB tape. The ground plane 11 is provided on one side of the polyimide tape 6, and the TAB lead 7 is provided on the other side thereof. The ground plane 11 is electrically connected to the ground. The land 5 is formed on the surface of the circuit substrate 3 as a first layer. The ground plane 12 is formed within the circuit substrate 3 as a second layer. The power supply plane 13 is formed on the reverse face of the circuit substrate 3 as a third layer. The ground plane 12 is electrically connected to the ground. The power supply plane 13 is electrically connected to a power supply. The TAB leads 7 act as micro strip lines by the presence of the ground plane 11 adjacent thereto, and the lands 5 act as micro strip lines by the presence of the ground plane 12 adjacent thereto.

Since the TAB leads 7 and the lands 5 are micro strip lines, the characteristic impedance of the TAB leads 7 and lands 5 is controlled. The ground plane 12 and the power supply plane 13 are formed pairwise to reduce the inductance of the power supply plane 13.

In the fourth preferred embodiment, the TAB leads 7 and the lands 5 are micro strip lines to achieve improved signal transmission. The ground plane 12 and power supply plane 13 formed pairwise provide stable power supply.

Fifth Preferred Embodiment

Figure 11:
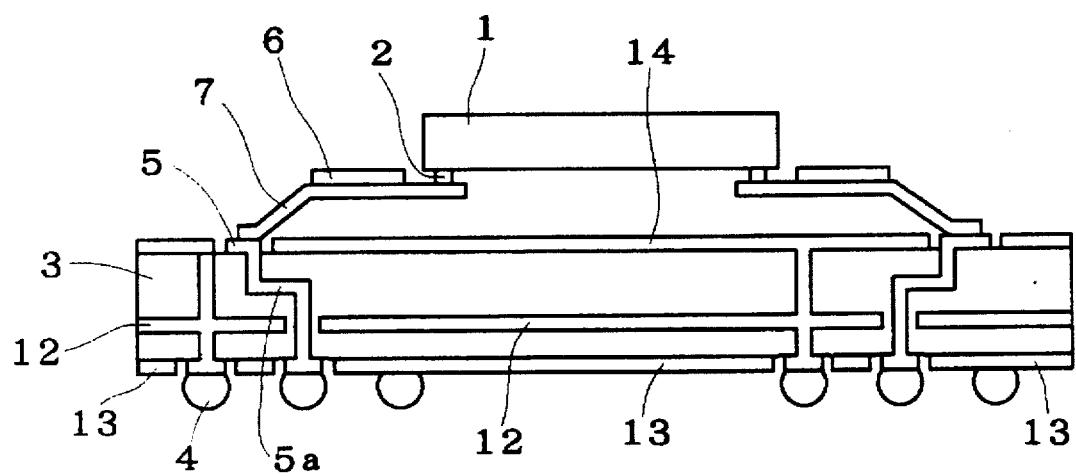
FIG. 11 illustrates the semiconductor device according to a fifth preferred embodiment of the present invention.

FIG. 11 illustrates the semiconductor device according to a fifth preferred embodiment of the present invention. In FIG. 11, the reference numeral 14 designates a ground plane. Other reference numerals and characters designate parts corresponding to those of FIG. 10.

Construction will be described below. In the fifth preferred embodiment, the TAB tape is a single-sided TAB tape. The polyimide tape 6 and the TAB lead 7 constitute the TAB tape. The lands 5 and the ground plane 14 are formed on the surface of the circuit substrate 3 as a first layer. Parts of the signal lines 5a which are parallel to the surface of the circuit substrate 3 are formed within the circuit substrate 3 as a second layer. The ground plane 12 is formed as a third layer within the circuit substrate 3 in a closer position to the reverse face of the circuit substrate 3 than the signal lines 5a. The power supply plane 13 is formed on the reverse face of the circuit substrate 3 as a fourth layer. The ground plane 14 is connected to the ground plane 12. The TAB leads 7 act as micro strip lines by the presence of the ground plane 14 adjacent thereto. The parts of the signal lines 5a which are parallel to the surface of the circuit substrate 3 act as micro strip lines by the presence of the ground plane 12 adjacent thereto. The ground plane 14 is provided between the parts of the signal lines 5a which are parallel to the surface of the circuit substrate 3 and the TAB leads 7.

Since the TAB leads 7 and the signal lines 5a are micro strip lines, the characteristic impedance of the TAB leads 7 and signal lines 5a is controlled. The ground plane 12 and the power supply plane 13 are formed pairwise to reduce the inductance of the power supply plane 13.

The double-sided TAB tape used for the semiconductor device of FIG. 10 is relatively expensive. In the fifth preferred embodiment, the use of the single-sided TAB tape which is relatively inexpensive may reduce costs of the semiconductor device. The TAB leads 7 and signal lines 5a are micro strip lines to provide improved signal transmission. The ground plane 12 and power supply plane 13 formed pairwise provide stable power supply. The ground plane 14 is provided between the signal lines 5a and the TAB leads 7 to suppress crosstalk between the signal lines 5a and the TAB leads 7.

Sixth Preferred Embodiment

Figure 12:
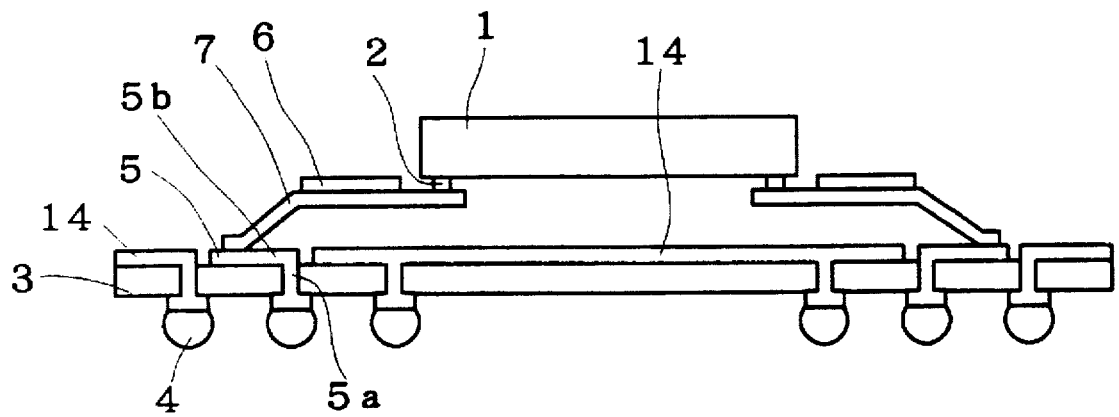
FIG. 12 illustrates the semiconductor device according to a sixth preferred embodiment of the present invention.

FIG. 12 illustrates the semiconductor device according to a sixth preferred embodiment of the present invention. In FIG. 12, the reference character 5b designates signal lines for connecting the connecting points of the TAB leads 7 and lands 5 to the signal lines 5a which are interconnecting lines within the circuit substrate 3. Other reference numerals and characters designate parts corresponding to those of FIG. 10.

Construction will be described below. In the sixth preferred embodiment, the TAB tape is a single-sided TAB tape. The polyimide tape 6 and the TAB lead 7 constitute the single-sided TAB tape. The ground plane 14 is electrically connected to the ground. The ground plane 14 is formed on the surface of the circuit substrate 3. The TAB leads 7 act as micro strip lines by the presence of the ground plane 14 adjacent thereto.

Figure 13:
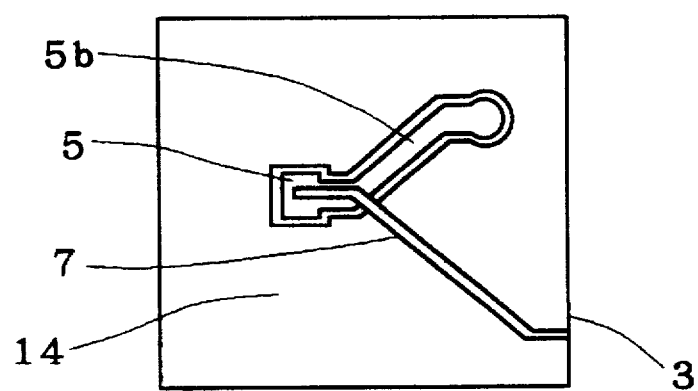
FIG. 13 is a top plan view of a circuit substrate 3 according to the sixth preferred embodiment of the present invention.

FIG. 13 is an enlarged view of a part of the surface of the circuit substrate 3 according to the sixth preferred embodiment of the present invention. The reference characters in FIG. 13 correspond to those in FIG. 12. As shown in FIG. 13, the ground plane 14 is formed in other than the land 5 and signal line 5b on the surface of the circuit substrate 3. The lands 5 and the signal lines 5b act as coplanar strip lines by the presence of the ground plane 14.

Since the TAB leads 7 are micro strip lines, the characteristic impedance of the TAB leads 7 is controlled.

In the sixth preferred embodiment, the use of the single-sided TAB tape which is relatively inexpensive may reduce costs of the semiconductor device. Since the TAB leads 7 are micro strip lines and the lands 5 and signal lines 5b are coplanar strip lines, improved signal transmission is provided. Additionally, the single ground plane 14 formed within the circuit substrate 3 may permit the circuit substrate 3 to be less expensive, reducing the costs of the semiconductor device.

Seventh Preferred Embodiment

Figure 14:
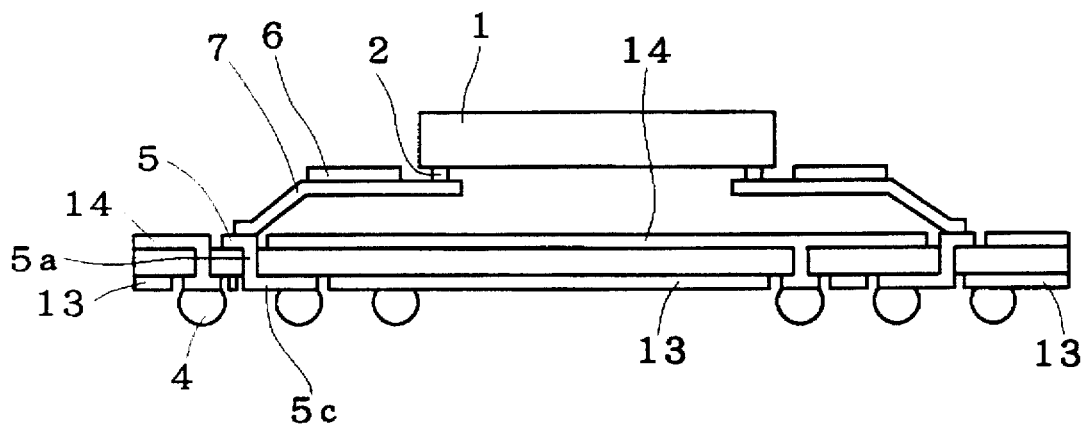
FIG. 14 illustrates the semiconductor device according to a seventh preferred embodiment of the present invention.

FIG. 14 illustrates the semiconductor device according to a seventh preferred embodiment of the present invention. In FIG. 14, the reference character 5c designates signal lines formed on the reverse face of the circuit substrate 3 for connecting the signal lines 5a which are the interconnecting lines within the circuit substrate 3 to the external connection electrodes 4. Other reference characters designate parts corresponding to those of FIG. 10.

Construction will be described below. In the seventh preferred embodiment, the TAB tape is a single-sided TAB tape. The polyimide tape 6 and the TAB lead 7 constitute the single-sided TAB tape. The ground plane 14 is electrically connected to the ground. The signal lines 5c are formed on the reverse face of the circuit substrate 3. The signal lines 5a and the external connection electrodes 4 are electrically connected to each other through the signal lines 5c. The power supply plane 13 is formed in other than the signal lines 5c on the reverse face of the circuit substrate 3. The power supply plane 13 is electrically connected to the power supply. The ground plane 14 is provided between the signal lines 5c and the TAB leads 7. The signal lines 5c and the TAB leads 7 act as micro strip lines by the presence of the ground plane 14.

Since the TAB leads 7 and the signal lines 5c are micro strip lines, the characteristic impedance of the TAB leads 7 and signal lines 5c is controlled. The ground plane 14 and the power supply plane 13 are formed pairwise to reduce the inductance of the power supply plane 13.

In the seventh preferred embodiment, the use of the single-sided TAB tape which is relatively inexpensive may reduce the costs of the semiconductor device. The TAB leads 7 and the signal lines 5c are micro strip lines to provide improved signal transmission. The single ground plane 14 formed within the circuit substrate 3 permits the circuit substrate 3 to be less expensive, reducing the costs of the semiconductor device. The ground plane 14 is provided between the signal lines 5a and the TAB leads 7 to suppress crosstalk between the signal lines 5c and the TAB leads 7. The ground plane 14 and power supply plane 13 formed pairwise provide stable power supply.

The fourth to seventh preferred embodiments are applicable to other preferred embodiments.

Eighth Preferred Embodiment

Figure 36:
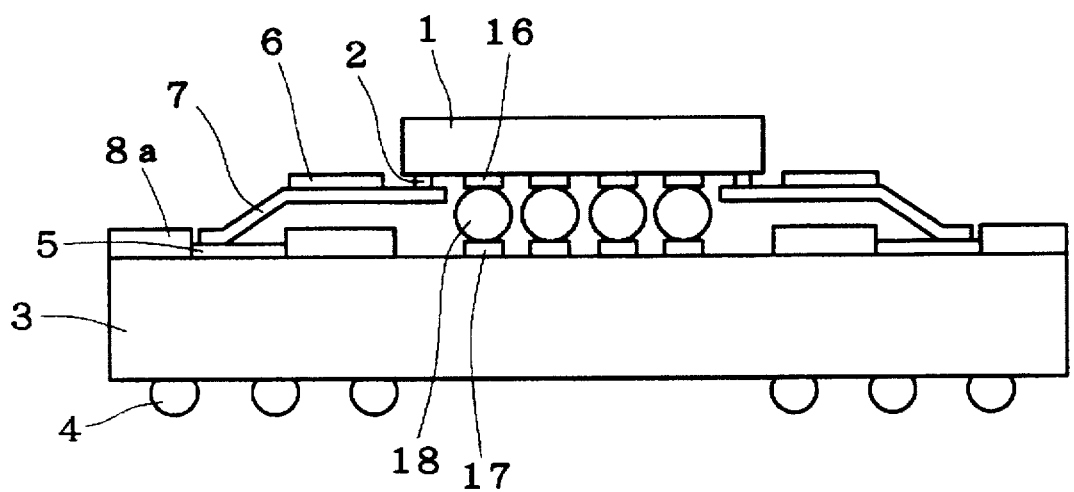
FIG. 36 illustrates a conventional semiconductor device.

First, a conventional semiconductor device is described. FIG. 36 illustrates a conventional semiconductor device as disclosed in Japanese Patent Application Laid-Open No. 2-106943 (1990). In FIG. 36, the reference character 8a designates a solder resist; 16 designates electrode pads which are a matrix array of electrodes formed on the surface of the semiconductor chip 1; 17 designates lands for internal bumps which are electrodes formed on the circuit substrate 3; and 18 designates internal electrode balls made of solder. Other reference numerals designate parts corresponding to those of FIG. 1.

The construction of the conventional semiconductor device will be discussed below as well as a method of fabricating the same. First, the semiconductor chip 1 having the bumps 2 and the electrode pads 16 is provided.

Then, the TAB tape is provided, and one end of the TAB lead 7 is connected to the bump 2. The other end of the TAB lead 7 is subjected to forming.

The circuit substrate 3 is prepared so that the surface thereof is opposed to the surface of the semiconductor chip 1. The circuit substrate 3 has the lands 5 and lands 17 for internal bumps formed on the surface thereof. The internal electrode balls 18 are previously connected to the lands 17 for internal bumps. The respective other ends of the TAB leads 7 are connected to the lands 5. This connection provides a position alignment of the electrode pads 16 relative to the internal electrode balls 18 to cause the electrode pads 16 and the internal electrode balls 18 to face each other. The above described forming is performed in order that the distance between the surface of the semiconductor chip 1 and the surface of the circuit substrate 3 may equal the sum of the diameter of the internal electrode balls 18 and the height of the electrode pads 16 (the size of the electrode pads 16 in the direction of the thickness of the above described semiconductor device).

Then, heat is applied to cause the internal electrode balls 18 to reflow, connecting the internal electrode balls 18 to the electrode pads 16. Then, the semiconductor device shown in FIG. 36 is completed.

The conventional semiconductor device constructed as above described presents problems to be described below. No contact might be made between the electrode pads 16 and the internal electrode balls 18, resulting in an electrical open. This results from the low rigidity of the TAB tape which is prone to be deformed by heat load during reflowing. Since the TAB leads 7 are connected to the lands 5, the internal electrode balls 18 and the electrode pads 16 are difficult to deviate from each other along the surface of the circuit substrate 3. However, the internal electrode balls 18 and the electrode pads 16 are prone to deviate in the direction of the thickness of the semiconductor device. Even if the forming is performed, the distance between the surface of the semiconductor chip 1 and the surface of the circuit substrate 3 might become greater than the sum of the diameter of the internal electrode balls 18 and the size of the electrode pads 16 in the direction of the thickness of the semiconductor device, causing the open.

An approach to solve the above described problem, or to prevent the open is to increase the volume of the internal electrode balls 18 to increase the amount of allowance of deviation of the internal electrode balls 18 and the electrode pads 16 in the direction of the thickness of the semiconductor device. However, the internal electrode balls 18 might become excessively crushed during reflowing into contact with each other, resulting in a short. The increase in volume of the internal electrode balls 18 necessitates the increase in height of the TAB leads 7 in the direction of the thickness of the semiconductor device during the forming. The increase in height of the TAB leads 7 exerts adverser effects on so-called coplanarity to cause deformation of the TAB leads 7 when connection is made between the TAB leads 7 and the lands 5, resulting in increased improper connections. A semiconductor device which solves the above described problems by means of another process is described below.

Figure 15:
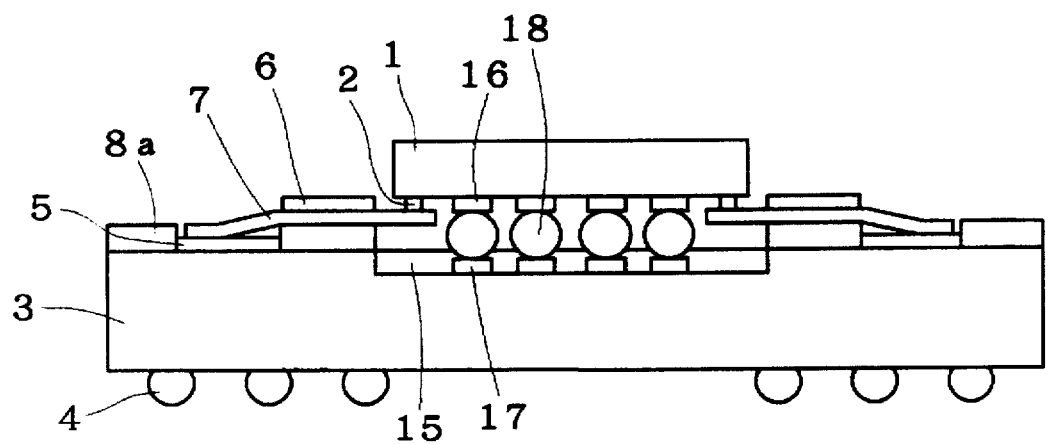
FIG. 15 illustrates the semiconductor device according to an eighth preferred embodiment of the present invention.

FIG. 15 illustrates the semiconductor device according to an eighth preferred embodiment of the present invention. In FIG. 15, the reference character 8a designates a solder resist for protecting the surface of the semiconductor device; 15 designates a cavity formed in the surface of the circuit substrate 3; 16 designates a matrix array of electrode pads formed on the surface of the semiconductor chip 1; 17 designates lands for internal bumps formed in the bottom of the cavity 15; and 18 designates internal electrode balls made of solder. Other reference numerals designate parts corresponding to those of FIG. 1.

The main construction will be described below. First, the construction of the semiconductor chip 1 is discussed below.

The bumps 2 are provided on the peripheral surface of the semiconductor chip 1. The multiplicity of electrode pads 16 are arranged in matrix form inside the bumps 2.

The circuit substrate 3 has the cavity 15 excavated from the surface of the circuit substrate 3. The lands 17 for internal bumps are provided in the bottom of the cavity 15. The arrangement of the multiplicity of lands 17 for internal bumps is identical with the matrix array of the electrode pads 16. The lands 17 for internal bumps and the external connection electrodes 4 are connected to each other through signal lines (not shown) within the circuit substrate 3. The electrode pads 16 and the lands 17 for internal bumps are electrically connected to each other through the internal electrode balls 18. Other elements of FIG. 15 are similar in construction to those of FIG. 1.

Input and output signals between the semiconductor chip 1 and the circuit substrate 3 are transmitted through the bumps 2 and the electrode pads 16. Input and output signals for the bumps 2 are transmitted to the external connection electrodes 4 through the TAB leads 7, the lands 5, and the signal lines (not shown) within the circuit substrate 3. Input and output signals for the electrode pads 16 are transmitted to the external connection electrodes 4 through the internal electrode balls 18, the lands 17 for internal bumps, and the signal lines (not shown) within the circuit substrate 3.

The detailed description of the construction is given while discussing the method of fabricating the semiconductor device of FIG. 15. First, the semiconductor chip 1 having the bumps 2 and the electrode pads 16 is prepared. The bumps 2 which are tens of microns in height are formed by plating the semiconductor chip 1 with Au. A two-layer barrier metal comprised of TiW and TiN or a three-layer barrier metal comprised of Cr, Cu, and Au is formed on the surface of the electrode pads 16.

The TAB tape is provided, and one end of the TAB lead 7 is connected to the bump 2. The TAB leads 7 are essentially made of copper and plated with Sn. One end of the TAB lead 7 is connected to the bump 2 by Au—Sn alloy connection between the TAB lead 7 and the bump 2 by means of thermal compression bonding. The TAB lead 7 is not subjected to forming but is flat.

Then, the circuit substrate 3 is prepared so that the surface thereof is opposed to the surface of the semiconductor chip 1. The circuit substrate 3 has the lands 5 formed on the surface thereof. The lands 5 are plated with Au. The circuit substrate 3 further includes the cavity 15, and the lands 17 for internal bumps in the bottom of the cavity 15. The internal electrode balls 18 are connected to the lands 17 for internal bumps. The flat solder resist 8a is formed on the surface of the circuit substrate 3 around the cavity 15. The flat TAB leads 7 and the flat solder resist 8a are arranged to be in contact with each other. The respective other ends of the TAB leads 7 are connected to the lands 5 by thermal compression bonding. This connection provides a position alignment of the electrode pads 16 relative to the internal electrode balls 18 to cause the electrode pads 16 and the internal electrode balls 18 to face each other.

The distance from the surface of the semiconductor chip 1 to the surface of the circuit substrate 3 (the bottom of the cavity 15) is substantially determined by the sum of the diameter of the internal electrode balls 18 and the height of the electrode pads 16. The depth of the cavity 15 from the surface of the circuit substrate 3 is approximately set to the sum. The cavity 15 has the constant depth from the surface of the circuit substrate 3 before reflowing as well as after. Thus, the distance from the surface of the semiconductor chip 1 to the surface of the circuit substrate 3 (the bottom of the cavity 15) is constant before reflowing as well as after, preventing deviations of the internal electrode balls 18 and the electrode pads 16 from each other in the direction of the thickness of the semiconductor device. Bonding the TAB leads 7 to the solder resist 8a during reflowing or pressing the TAB leads 7 against the circuit substrate 3 to fix the TAB leads 7 on the circuit substrate 3 by using a clip-shaped tool during reflowing may further prevent the deviations.

Heat is applied to cause the internal electrode balls 18 to reflow, connecting the internal electrode balls 18 to the electrode pads 16. This completes the semiconductor device shown in FIG. 15.

In the eighth preferred embodiment, the provision of the cavity 15 prevents the deviations to suppress an open between the electrodes pads 16 and the internal electrode balls 18, increasing the yield of the semiconductor devices. Since the TAB leads 7 are not subjected to forming, the TAB leads 7 are prevented from being deformed when the TAB leads 7 are connected to the lands 5. This allows correct connection between the TAB leads 7 and the lands 5 to increase the yield of the semiconductor devices. Further, the semiconductor device of the eighth preferred embodiment which comprises the internal electrode balls 18 and the electrode pads 16 in addition to the components of a semiconductor device having only the TAB tape and flip-chip bumps such as the bumps 2 may be applied to the semiconductor chip 1 including more electrodes.

The internal electrode balls 18 may be replaced with bumps of Au formed on the electrode pads 16 to be electrically connected to the lands 17 for internal bumps coated with solder paste.

Ninth Preferred Embodiment

Figure 16:
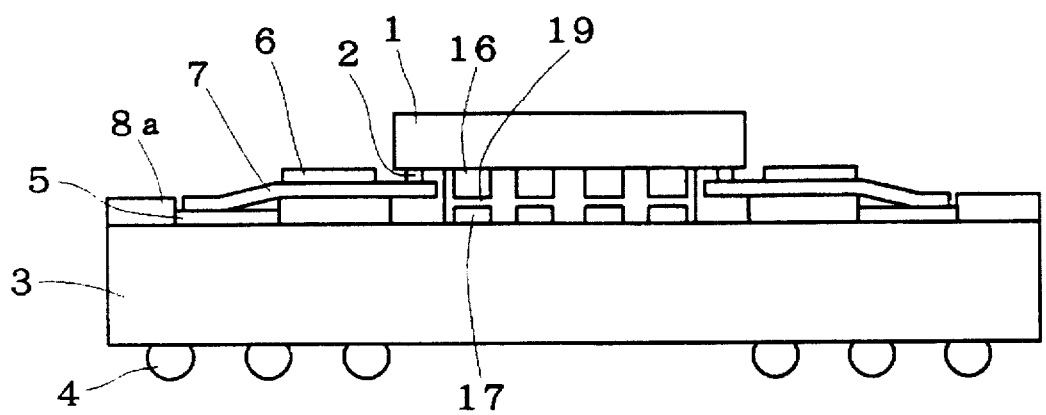
FIG. 16 illustrates the semiconductor device according to a ninth preferred embodiment of the present invention.

FIG. 16 illustrates the semiconductor device according to a ninth preferred embodiment of the present invention. In FIG. 16, the reference numeral 19 designates an anisotropic conductive resin for electrically and mechanically connecting the electrode pads 16 and the lands 17 for internal bumps together. Other reference numerals and characters designate parts corresponding to those of FIG. 15.

The main construction will be described below. The semiconductor chip 1 of FIG. 16 is similar in construction to that of FIG. 15.

The lands 17 for internal bumps are formed on the surface of the circuit substrate 3. The arrangement of the multiplicity of lands 17 for internal bumps is identical with the matrix array of the electrode pads 16. The anisotropic conductive resin 19 electrically and mechanically connect the electrode pads 16 and the lands 17 for internal bumps to each other. Other elements of FIG. 16 are similar in construction to those of FIG. 15.

The detailed description of the construction will be given while discussing the method of fabricating the semiconductor device shown in FIG. 16. First, the semiconductor chip 1 having the bumps 2 and the electrode pads 16 is prepared. The bumps 2 which are tens of microns in height are formed by plating the semiconductor chip 1 with Au. The electrode pads 16 are formed by Au plating simultaneously with the Au plating of the bumps 2.

Then, the TAB tape is provided, and one end of the TAB lead 7 is connected to the bump 2. The TAB lead 7 are essentially made of copper plated with Sn. The one end of the TAB lead 7 is connected to the bump 2 by Au—Sn alloy connection between the bump 2 and the TAB lead 7 by means of thermal compression bonding. The TAB lead 7 is not subjected to forming but is flat.

The circuit substrate 3 is prepared so that the surface thereof is opposed to the surface of the semiconductor chip 1. The lands 17 for internal bumps and the lands 5 are formed on the surface of the circuit substrate 3. The anisotropic conductive resin 19 is previously applied to the upper surfaces of the lands 7 for internal bumps. The lands 5 are plated with Au. The flat solder resist 8a is formed on the surface of the circuit substrate 3 around the lands 17 for internal bumps. The flat TAB leads 7 and the flat solder resist 8a are arranged to be in contact with each other. The respective other ends of the TAB leads 7 are connected to the lands 5 by thermal compression bonding. This connection provides a position alignment of the electrode pads 16 relative to the lands 17 for internal bumps to cause the electrode pads 16 and the internal electrode balls 18 to face each other. If a mechanical pressure is applied in such a direction that the semiconductor chip 1 is opposed to the circuit substrate 3, the anisotropic conductive resin 19 establishes an electrical connection between the electrode pads 16 and the lands 17 for internal bumps which are in face to face relation.

Pressure and heat are applied to the reverse face of the semiconductor chip 1 by using a heating tool to establish electrical and mechanical connection between the lands 17 for internal bumps and the electrode pads 16 by using the anisotropic conductive resin 19. This completes the semiconductor device shown in FIG. 16.

In the ninth preferred embodiment, the anisotropic conductive resin 19 electrically connects the lands 17 for internal bumps and the electrode pads 16 to each other to suppress an open between the electrode pads 16 and the lands 17 for internal bumps, improving the yield of the semiconductor devices. If the amount of the anisotropic conductive resin 19 applied to the upper surfaces of the lands 17 for internal bumps is limited to a minimum which allows the mechanical and electrical connection between the lands 17 for internal bumps and the electrode pads 16 to be made, the height of the TAB leads 7 is reduced to eliminate the need to perform the forming on the TAB leads 7. Since the TAB leads 7 are not subjected to forming, the TAB leads 7 are prevented from being deformed when the TAB leads 7 are connected to the lands 5. This allows proper connection between the TAB leads 7 and the lands 5 to improve the yield of the semiconductor devices. Further, the semiconductor device of the ninth preferred embodiment which comprises the internal electrode balls 18 and the electrode pads 16 in addition to the components of a semiconductor device including only the TAB tape and flip-chip bumps such as the bumps 2 may be applied to the semiconductor chip 1 including more electrodes.

Tenth Preferred Embodiment

Figure 17:
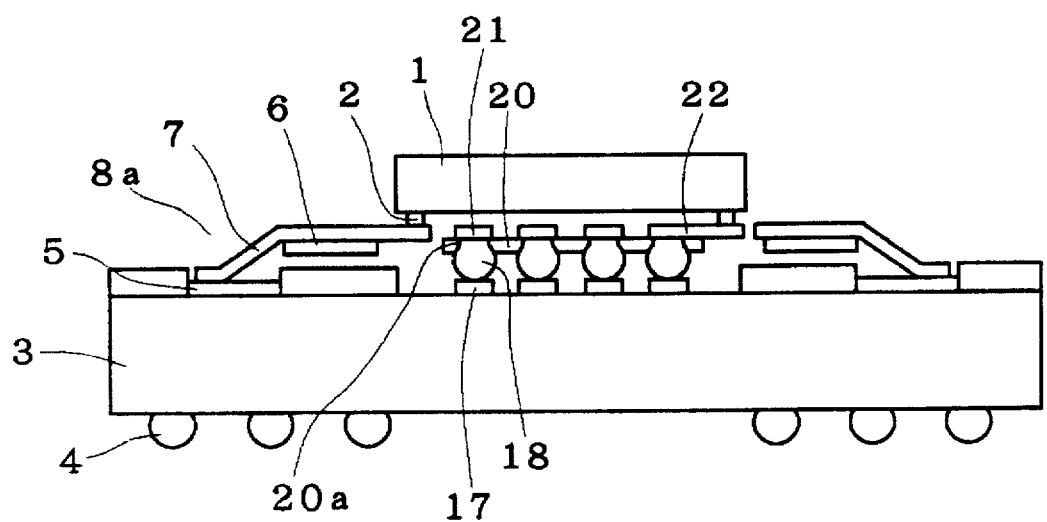
FIG. 17 illustrates the semiconductor device according to a tenth preferred embodiment of the present invention.

FIG. 17 illustrates the semiconductor device according to a tenth preferred embodiment of the present invention. In FIG. 17, the reference numeral 20 designates a polyimide tape generally used as a TAB tape; the reference character 20a designates a matrix array of openings formed in the polyimide tape 20; 21 designates electrode lands formed on the openings 20a; and 22 designates TAB leads connected to the electrode lands 21. Other reference numerals and characters designate parts corresponding to those of FIG. 15.

The main construction is described below. The semiconductor chip 1 of FIG. 17 is similar in construction to that of FIG. 1.

The lands 17 for internal bumps are formed on the circuit substrate 3. The arrangement of the multiplicity of lands 17 for internal bumps is identical with the matrix array of the openings 20a. The lands 17 for internal bumps and the electrode lands 21 are electrically connected to each other through the internal electrode balls 18.

Figure 18:
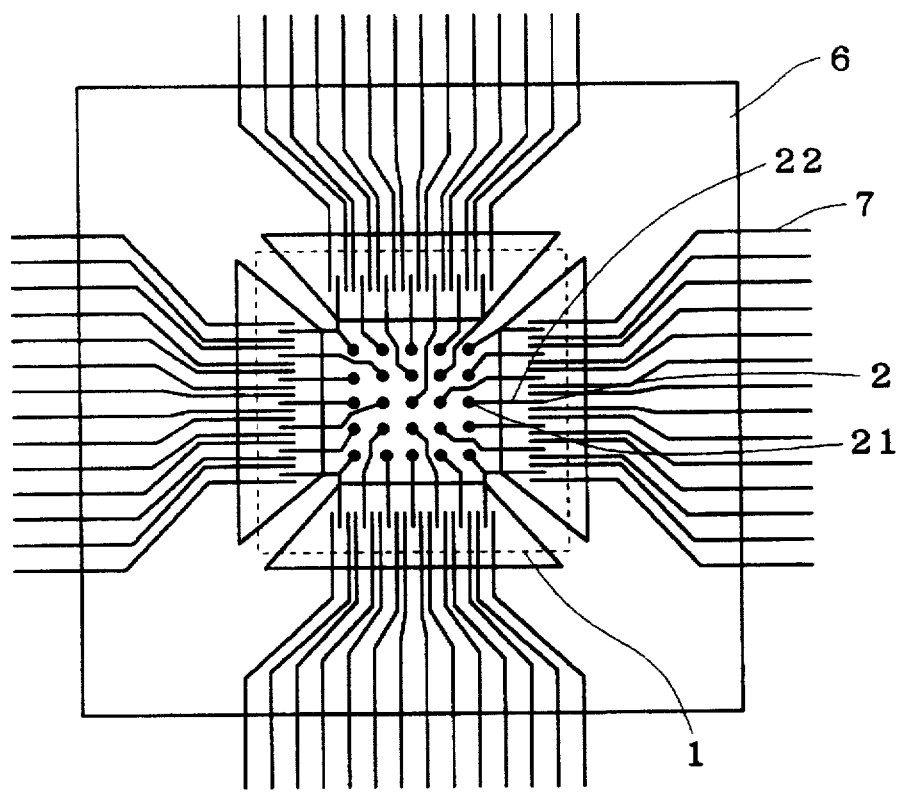
FIG. 18 is a top plan view of the semiconductor device according to the tenth preferred embodiment of the present invention.

FIG. 18 is a top plan view of the semiconductor device according to the tenth preferred embodiment of the present invention. The reference numerals in FIG. 18 correspond to those in FIG. 17. The electrode lands 21 are connected to some of the multiplicity of bumps 2 through the TAB leads 22. Other bumps 2 are connected to the TAB leads 7. The TAB tape comprised of the poly imide tape 20 and the TAB lead 22, and the TAB tape comprised of the polyimide tape 6 and the TAB lead 7 are formed from the same tape base material.

Input and output signals between the semiconductor chip 1 and the circuit substrate 3 are transmitted through the bumps 2. Input and output signals for some of the bumps 2 are transmitted to the external connection electrodes 4 through the TAB leads 22, the electrode lands 21, the internal electrode balls 18, the lands 17 for internal bumps, and the signal lines (not shown) within the circuit substrate 3. Input and output signals for other bumps 2 are transmitted to the external connection electrodes 4 through the TAB leads 7, the lands 5, and the signal lines (not shown) within the circuit substrate 3.

The detailed description of the construction will be given while discussing the method of fabricating the semiconductor device shown in FIG. 17. First, the semiconductor chip 1 having the bumps 2 is provided. The bumps 2 which are tens of microns in height are formed by plating the semiconductor chip 1 with Au.

Then, the TAB tape is provided, and one end of the TAB lead 7 is connected to the bump 2. The TAB leads 7 are essentially made of copper plated with Sn. The one end of the TAB lead 7 is connected to the bump 2 by Au—Sn alloy connection between the bump 2 and the TAB lead 7 by means of thermal compression bonding.

The circuit substrate 3 is prepared so that the surface thereof is opposed to the surface of the semiconductor chip 1. The lands 5 and the internal electrode balls 18 are formed on the surface of the circuit substrate 3. The lands 5 are plated with Au. The internal electrode balls 18 are connected to the lands 17 for internal bumps arranged in matrix form on the surface of the circuit substrate 3. The respective other ends of the TAB leads 7 are connected to the lands 5 by thermal compression bonding. This connection provides a position alignment of the openings 20a relative to the internal electrode balls 18 to cause the openings 20a and the internal electrode balls 18 to face each other.

Heat application causes reflow to melt the internal electrode balls 18. Then, solder fills the openings 20a to connect the internal electrode balls 18 to the polyimide tape 20. This completes the semiconductor device shown in FIG. 17.

In the tenth preferred embodiment, signals are inputted to and outputted from the semiconductor chip 1 only through the bumps 2 formed around the semiconductor chip 1. This eliminates the need for the electrode pads 16 shown in FIG. 16 to provide a high degree of freedom of circuit design within the semiconductor chip 1, permitting efficient design of the semiconductor device.

Eleventh Preferred Embodiment

Figure 19:
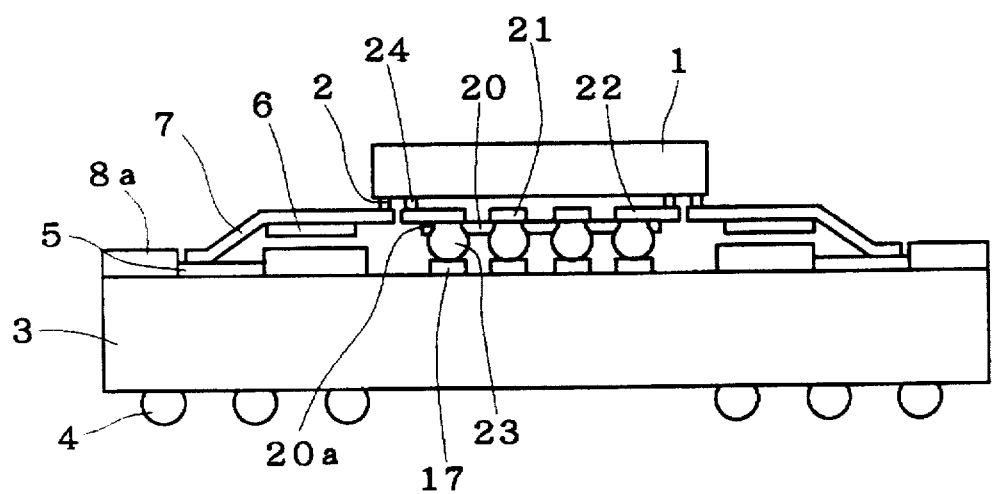
FIG. 19 illustrates the semiconductor device according to an eleventh preferred embodiment of the present invention.

FIG. 19 illustrates the semiconductor device according to an eleventh preferred embodiment of the present invention. In FIG. 19, the reference numeral 24 designates bumps formed of gold, solder or the like on the surface of the semiconductor chip 1 inside the bumps 2 and serving as protruding electrodes. Other reference numerals and characters designate parts corresponding to those of FIG. 17.

The main construction will be described below. The semiconductor chip 1 of FIG. 19 further comprises the bumps 24 formed inside the bumps 2 in addition to the semiconductor chip 1 of FIG. 1.

The lands 17 for internal bumps are formed on the surface of the circuit substrate 3. The arrangement of the multiplicity of lands 17 for internal bumps is identical with the matrix array of the openings 20a. The lands 17 for internal bumps and the electrode lands 21 are electrically connected to each other through the internal electrode balls 18.

Figure 20:
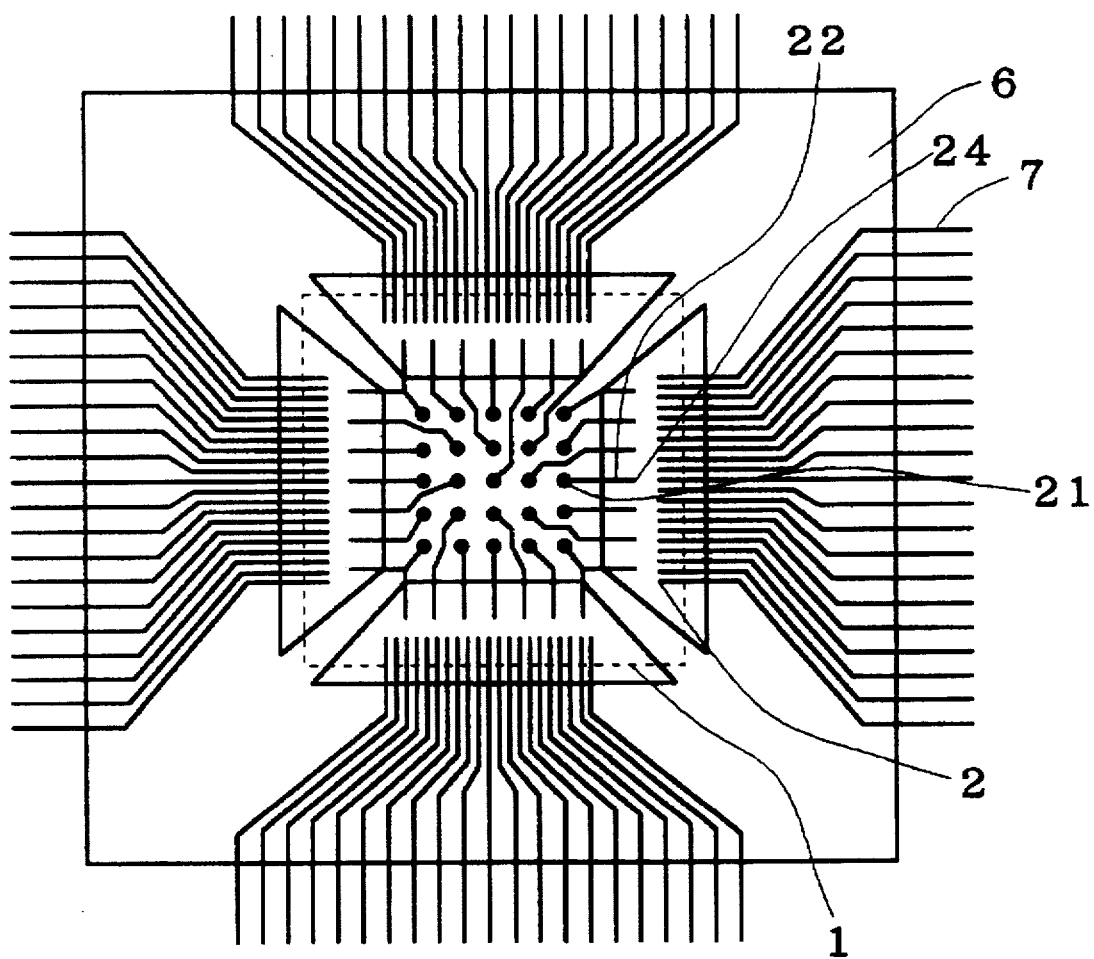
FIG. 20 is a top plan view of the semiconductor device according to the eleventh preferred embodiment of the present invention.

FIG. 20 is a top plan view of the semiconductor device according to the eleventh preferred embodiment of the present invention. The reference numerals in FIG. 20 correspond to those in FIG. 19. The electrode lands 21 and the bumps 24 are electrically connected to each other through the TAB leads 22. The bumps 2 are connected to the TAB leads 7. The TAB tape comprised of the polyimide tape 20 and the TAB lead 22, and the TAB tape comprised of the polyimide tape 6 and the TAB lead 7 are formed from the same tape base material.

Input and output signals between the semiconductor chip 1 and the circuit substrate 3 are transmitted through the bumps 2 and 24. Input and output signals for the bumps 24 are transmitted to the external connection electrodes 4 through the TAB leads 22, the electrode lands 21, the internal electrode balls 18, the lands 17 for internal bumps, and the signal lines (not shown) within the circuit substrate 3. Input and output signals for the bumps 2 are transmitted to the external connection electrodes 4 through the TAB leads 7, the lands 5, and the signal lines (not shown) within the circuit substrate 3.

The detailed description of the construction will be given while discussing the method of fabricating the semiconductor device shown in FIG. 19. First, the semiconductor chip 1 having the bumps 2 and 24 is provided. The bumps 2 and 24 which are tens of microns in height are formed by plating the semiconductor chip 1 with Au.

Then, the TAB tape is provided, and one end of the TAB lead 7 is connected to the bump 2. One end of the TAB lead 22 is connected to the bump 24. The TAB leads 7 and the bumps 24 are essentially made of copper plated with Sn. The one end of the TAB lead 7 is connected to the bump 2 by Au—Sn alloy connection between the bump 2 and the TAB lead 7 by means of thermal compression bonding. The one end of the TAB lead 22 is connected to the bump 24 in similar manner.

The circuit substrate 3 is prepared so that the surface thereof is opposed to the surface of the semiconductor chip 1. The lands 5 and the internal electrode balls 18 are formed on the surface of the circuit substrate 3. The lands 5 are plated with Au. The internal electrode balls 18 are connected to the lands 17 for internal bumps arranged in matrix form on the surface of the circuit substrate 3. The respective other ends of the TAB leads 7 are connected to the lands 5 by thermal compression bonding. This connection provides a position alignment of the openings 20a relative to the internal electrode balls 18 to cause the openings 20a and the internal electrode balls 18 to face each other.

Heat application causes reflow to melt the internal electrode balls 18. Then, solder fills the openings 20a to connect the internal electrode balls 18 to the polyimide tape 20. This completes the semiconductor device shown in FIG. 19.

In the eleventh preferred embodiment, the signals are inputted to and outputted from the semiconductor chip 1 only through the bumps 2 and 24 formed in the peripheral part of the semiconductor chip 1. This eliminates the need for the electrode pads 16 shown in FIG. 16 to improve the degree of freedom of circuit design within the semiconductor chip 1, permitting efficient design of the semiconductor device. The provision of the bumps 2 and 24 serving as dual terminals for the semiconductor chip 1, with the inside and outside bumps 24 and 2 connected respectively to the polyimide tapes 20 and 6, allows the semiconductor chip 1 having the bumps 2 and 24 to have a greater pitch of bumps than that having only the bumps 2 in the case of the equal number of bumps. This provides for proper connections between the bumps 2 and the polyimide tape 6 and between the bumps 24 and the polyimide tape 20, improving the yield of the semiconductor devices. The semiconductor chip 1 having both of the bumps 2 and 24 may include more terminals than the semiconductor chip 1 having only the bumps 2 in the case of the equal pitch of the bumps.

The eighth to eleventh preferred embodiments are applicable to other preferred embodiments.

Twelfth Preferred Embodiment

Figure 37:
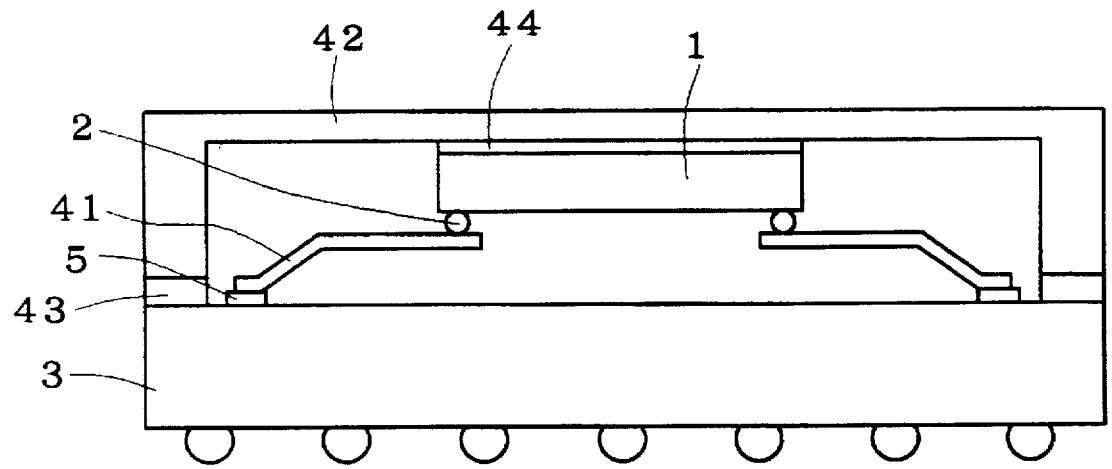
FIG. 37 illustrates a semiconductor device using a cap.

FIG. 37 illustrates the semiconductor device which comprises a cap in place of the sealing resin 8. In FIG. 37, the reference numeral 41 designates a polyimide tape made of polyimide and copper for extracting electrical characteristics from the semiconductor chip 1; 42 designates a cap made of an alloy of iron and nickel, ceramic, or the like for protecting the semiconductor chip 1 and the polyimide tape 41 against external environments; 43 designates a sealing resin made of epoxy for connecting the circuit substrate 3 to the cap 42; and 44 designates a die bonding resin made of epoxy resin or the like for fixing the semiconductor chip 1 to the cap 42. Other reference numerals designate parts corresponding to those of FIG. 1. FIG. 37 corresponds to FIG. 6.

The semiconductor device shown in FIG. 37 which uses the cap 42 is costly. In the fabrication steps, one end of the polyimide tape 41 is connected to the semiconductor chip 1 while the other end thereof is connected to the land 5. Then, the cap 42 covers the semiconductor chip 1 to connect the cap 42 to the reverse face (upper surface in FIG. 42) of the semiconductor chip 1. During the connection, the polyimide tape 41 is loaded and the bumps 2 might be broken, resulting in decreased reliability of the semiconductor device. A semiconductor device for solving the above described problems will be described below.

Figure 21:
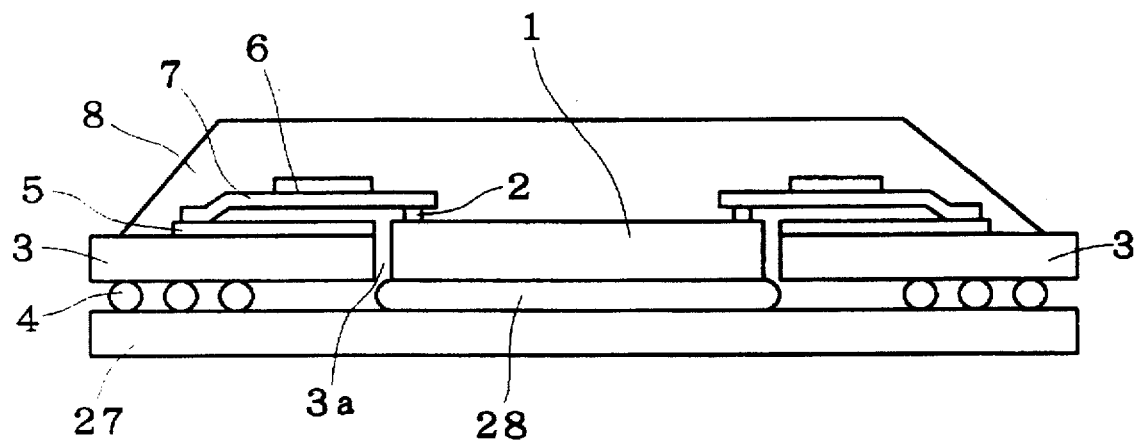
FIG. 21 illustrates the semiconductor device according to a twelfth preferred embodiment of the present invention.

FIG. 21 illustrates the semiconductor device according to a twelfth preferred embodiment of the present invention. In FIG. 21, the reference character 3a designates a through opening extending centrally through the circuit substrate 3; 27 designates a mounting substrate made of glass fiber reinforced plastic, FR4, or the like; and 28 designates a die bonding resin made of epoxy for connecting the semiconductor chip 1 to the mounting substrate 27. Other reference numerals designate parts corresponding to those of FIG. 1.

Construction will be described below. The semiconductor chip 1 is placed in the through opening 3a, with the reverse face thereof directed toward the mounting substrate 27 (downside in FIG. 21). The bumps 2 and the lands 5 are electrically connected to each other through the TAB leads 7. The die bonding resin 28 is provided between the semiconductor chip 1 and the mounting substrate 27 to connect the semiconductor chip 1 to the mounting substrate 27. The lands 5 are electrically connected to the external connection electrodes 4 through the signal lines (not shown) within the circuit substrate 3. The external connection electrodes 4 are connected to the mounting substrate 27. The die bonding resin 28 is included in the mounting substrate 27.

Figure 23:
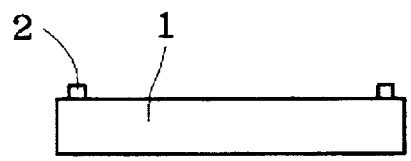
FIGS. 23 through 26 illustrate the method of fabricating the semiconductor device according to the twelfth preferred embodiment of the present invention.

A method of fabricating the semiconductor device shown in FIG. 21 is discussed below. Referring to FIG. 23, the semiconductor chip 1 having the bumps 2 is provided.

Figure 24:
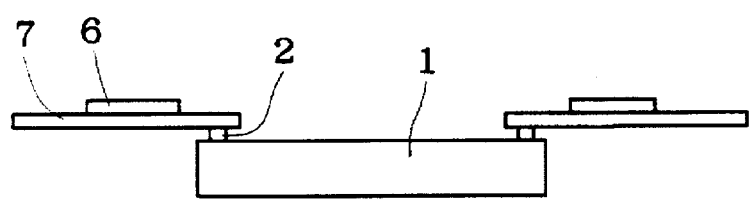

With reference to FIG. 24, one end of the TAB lead 7 is electrically connected to the bump 2.

Figure 25:
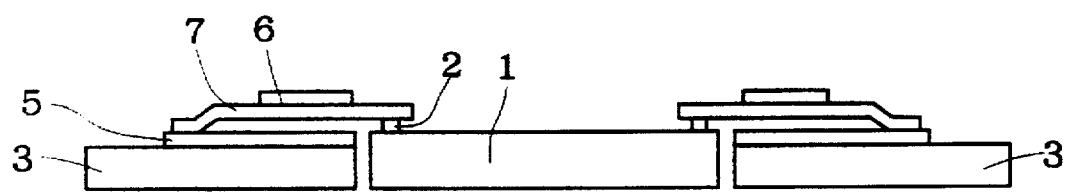

As illustrated in FIG. 25, the circuit substrate 3 having the lands 5 and the through opening 3a is provided, with the surface thereof oriented in the same direction as the surface of the semiconductor chip 1, and the semiconductor chip 1 is placed in the through opening 3a. The other end of the TAB lead 7 is electrically connected to the land 5.

Figure 26:
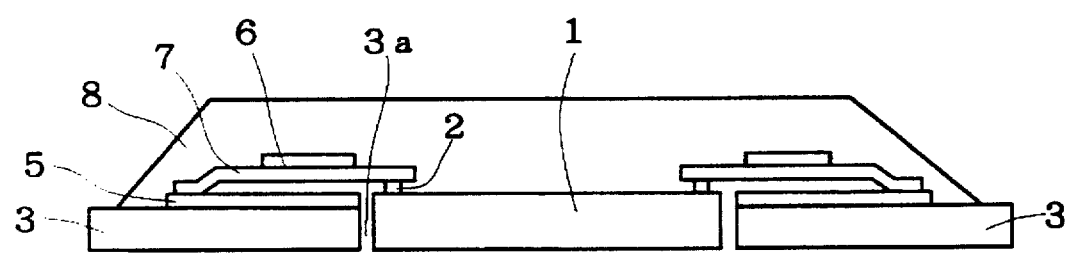

Referring to FIG. 26, the sealing resin 8 is formed over the semiconductor chip 1, the TAB leads 7, and the circuit substrate 3.

Figure 27:
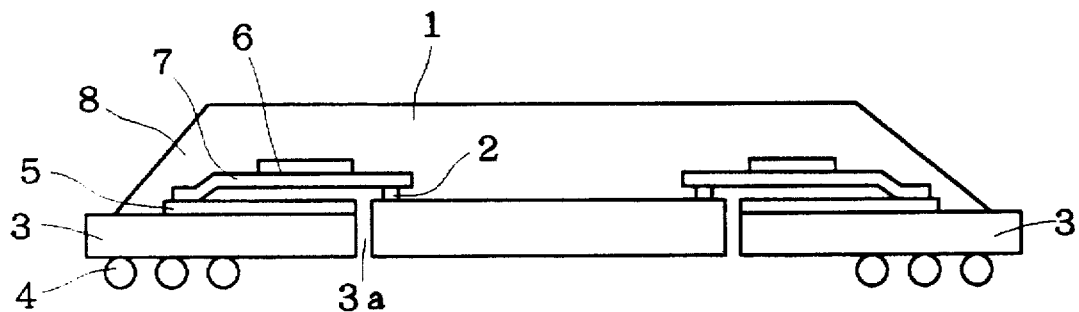
FIG. 27 illustrates the semiconductor device according to the twelfth preferred embodiment of the present invention.

As depicted in FIG. 27, the external connection electrodes 4 electrically connected to the lands 5 through the signal lines (not shown) within the circuit substrate 3 are formed on the reverse face of the circuit substrate 3. This completes the semiconductor device.

In the twelfth preferred embodiment, heat generated by the semiconductor chip 1 is dissipated through the die bonding resin 28 toward the mounting substrate 27. The semiconductor device has a greatly improved heat dissipation property.

Figure 22:
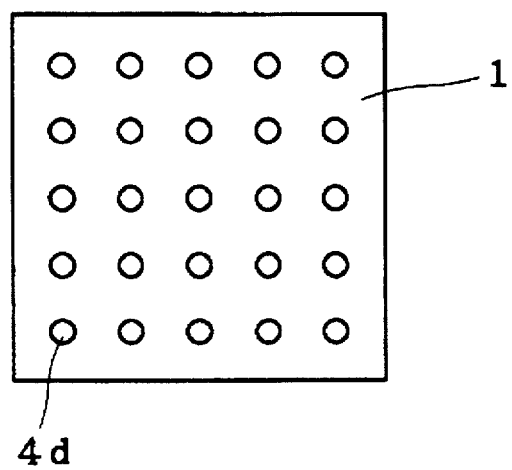
FIG. 22 illustrates the semiconductor device of another form according to the twelfth preferred embodiment of the present invention.

The die bonding resin 28 may be replaced with lands 4d made of a thermally conductive material for heat dissipation as shown in FIG. 22. In this case, heat generated by the semiconductor chip 1 is dissipated through the lands 4d toward the mounting substrate 27. The semiconductor device has a greatly improved heat dissipation property and is reduced in thickness. Particularly, if heat is generated in a particular part of the semiconductor chip 1, the lands 4d should be provided in this part to efficiently dissipate the heat. The thickness of the semiconductor device may be reduced if the configuration of the lands is a sphere, a right circular cylinder, or a circular cone with a flat top end.

Thirteenth Preferred Embodiment

Figure 38:
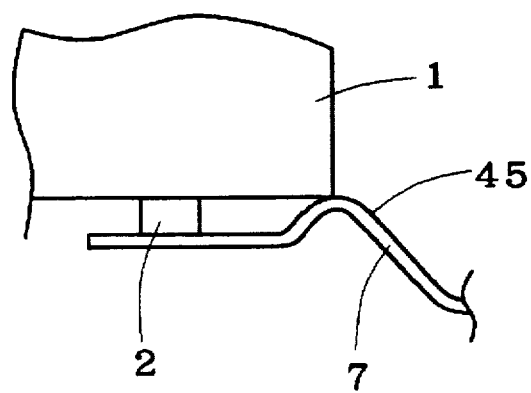
FIG. 38 illustrates a TAB tape which is bent.

For example, when the TAB leads 7 are connected to the lands 5 as shown in FIG. 3, low positioning accuracy and uneven tension in the TAB tape might cause the TAB lead 7 to be bent as shown in FIG. 38 (designated at 45), resulting in a short of adjacent TAB tapes and bumps 2. Additionally, vibrations created during the transportation of the TAB tape connected to the semiconductor chip 1 before the TAB tape is connected to the circuit substrate 3 as shown FIG. 4 might apply stresses to the TAB tape, creating a crack in the bumps 2. The semiconductor device for solving the above described problems is discussed below.

Figure 28:
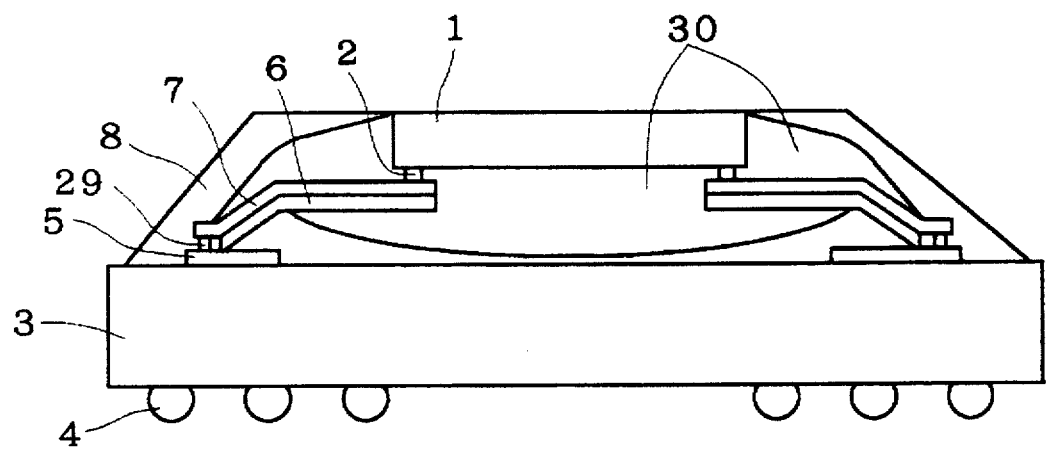
FIG. 28 illustrates the semiconductor device according to a thirteenth preferred embodiment of the present invention.

FIG. 28 illustrates the semiconductor device according to a thirteenth preferred embodiment of the present invention. In FIG. 28, the reference numeral 29 designates bump junctions for connecting the TAB leads 7 to the lands 5; and 30 designates a precoat resin for protecting the semiconductor device before the sealing resin 8 mainly covers the surface of the semiconductor device. Other reference numerals designate parts corresponding to those of FIG. 1.

Construction will be described below. The TAB leads 7 and the lands 5 are electrically connected to each other through the bump junctions 29. The precoat resin 30 is in contact with the semiconductor chip 1, the bumps 2, and the polyimide tape 6. Other elements of FIG. 28 are substantially similar in construction to those of FIG. 1.

Figure 29:
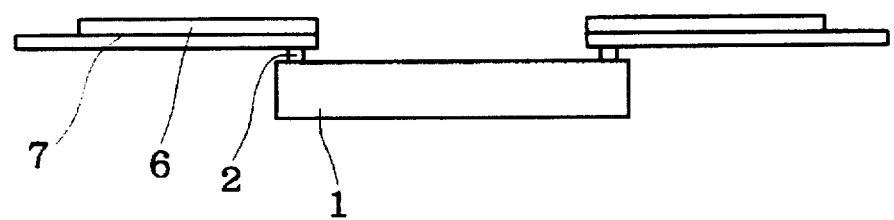
FIGS. 29 through 31 illustrate the method of fabricating the semiconductor device according to the thirteenth preferred embodiment of the present invention.

The method of fabricating the semiconductor device shown in FIG. 28 is discussed below. Referring to FIG. 29, the semiconductor chip 1 having the bumps 2 and the TAB tape are provided, and one end of the TAB lead 7 is electrically connected to the bump 2.

Figure 30:
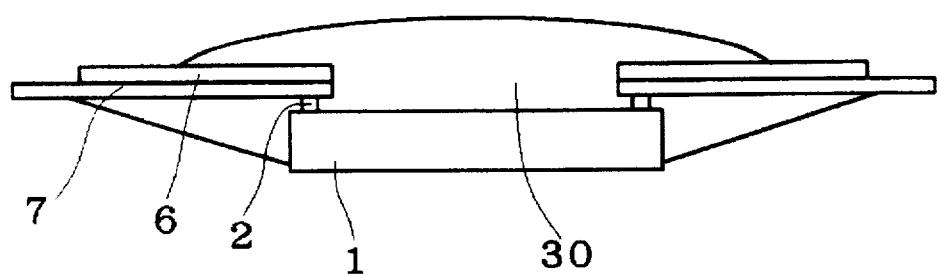

Then, as shown in FIG. 30, the precoat resin 30 is formed in contact with the semiconductor chip 1, the bumps 2, the polyimide tape 6, and the TAB leads 7 to fix the TAB tape to the semiconductor chip 1. The precoat resin 30 should contact at least a part of the semiconductor chip 1 including the bumps 2 and at least a part of the TAB tape.

Figure 31:
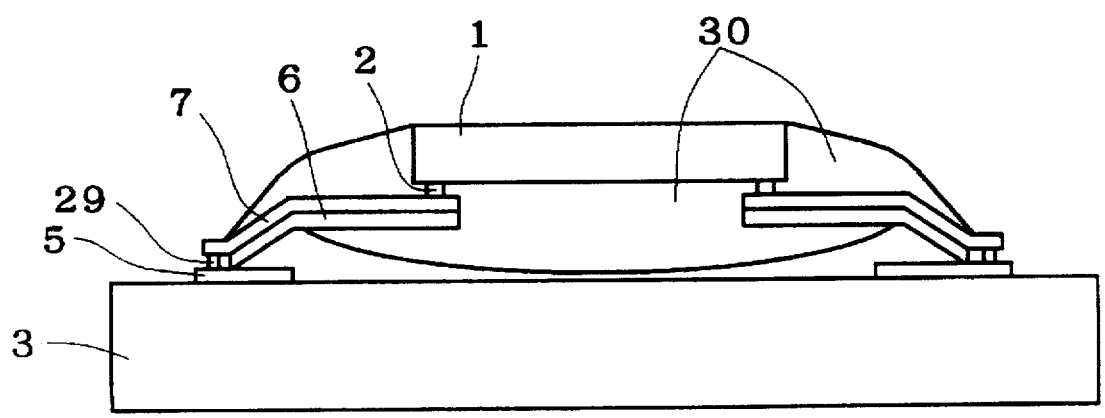

With reference to FIG. 31, the circuit substrate 3 having the lands 5 is provided so that the surface thereof is opposed to the surface of the semiconductor chip 1. The respective other ends of the TAB leads 7 are electrically connected to the lands 5 through the bump junctions 29.

The sealing resin 8 is formed to cover the reverse face of the semiconductor chip 1 and the surface of the circuit substrate 3. The external connection electrodes 4 are formed on the reverse face of the circuit substrate 3. This completes the semiconductor device shown in FIG. 29.

In the thirteenth preferred embodiment, the precoat resin 30 fixes the semiconductor chip 1 and the TAB tape to suppress the bending of the TAB leads 7 during the connection of the TAB leads 7 to the lands 5, preventing a short of adjacent TAB tapes and bumps 2. Further, the TAB tape is subjected to no stresses due to vibrations during the transportation of the TAB tape connected to the semiconductor chip 1 before the TAB tape is connected to the circuit substrate 3, preventing cracks in the bumps 2. In this manner, the incomplete semiconductor device is easily handled in the steps after the formation of the precoat resin 30, and a highly reliable semiconductor device is accomplished.

The thirteenth preferred embodiment is applicable to other preferred embodiments.

Fourteenth Preferred Embodiment

Figure 39:
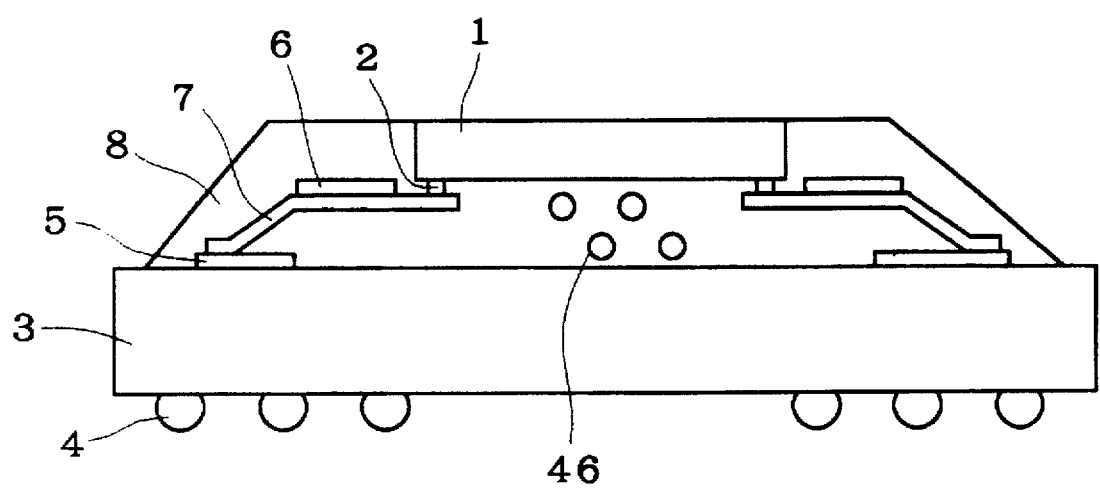
FIG. 39 illustrates bubbles in a sealing resin 8.

For example, if the sealing resin 8 supplied from the exterior of the semiconductor device to the surroundings of the semiconductor chip 1 is left flown to under the semiconductor chip 1 as shown in FIG. 5, the sealing resin 8 sometimes flows while containing a multiplicity of bubbles 46 as shown in FIG. 39. In other cases, air is not discharged but remains under the semiconductor chip 1 to prevent the sealing resin 8 from completely filling the space under the semiconductor chip 1, resulting in unfilled portions. These problems decrease the reliability of the semiconductor device.

Figure 32:
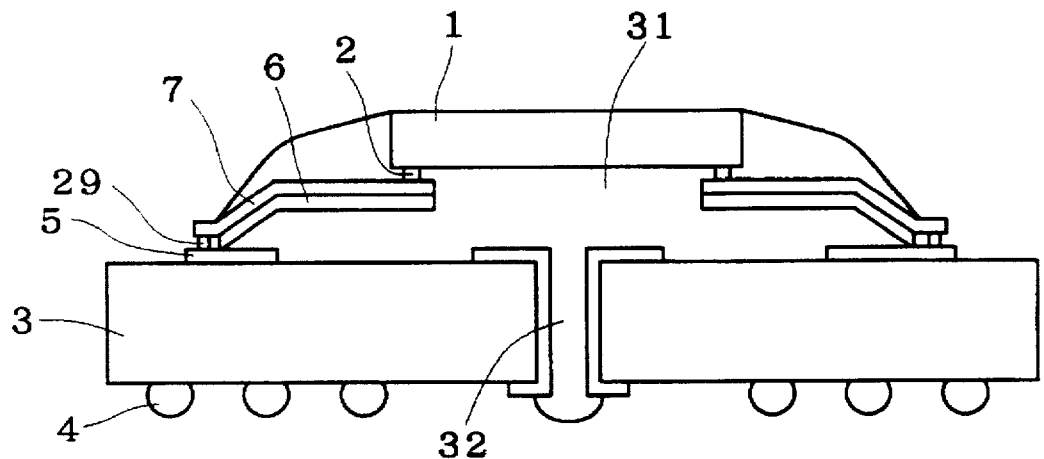
FIG. 32 illustrates the semiconductor device according to a fourteenth preferred embodiment of the present invention.

FIG. 32 illustrates the semiconductor device according to a fourteenth preferred embodiment of the present invention. In FIG. 32, the reference numeral 31 designates a resin (mold) for covering the surface of the semiconductor device to protect the semiconductor device; and 32 designates a through opening formed in the circuit substrate 3 immediately under the semiconductor chip 1. Other reference numerals designate parts corresponding to those of FIG. 28.

Construction will be described below. The circuit substrate 3 has the through opening 32 immediately under the semiconductor chip 1. The resin 31 fills the space surrounded by the semiconductor chip 1, the bumps 2, the polyimide tape 6, and the circuit substrate 3 and also covers the exterior of the space. The resin 31 contains few bubbles 46. Other elements of FIG. 32 are similar in construction to those of FIG. 28. The through opening 32 may include a plurality of through openings.

Figure 33:
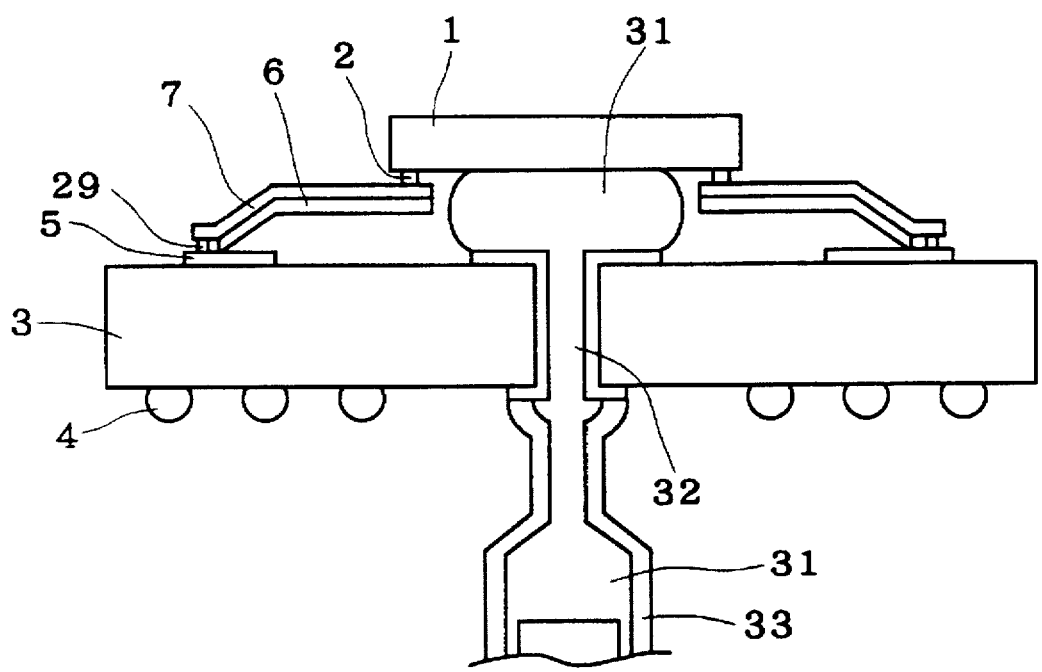
FIG. 33 illustrates the method of fabricating the semiconductor device according to the fourteenth preferred embodiment of the present invention.

The method of fabricating the semiconductor device shown in FIG. 32 is described below. FIG. 33 illustrates the method of fabricating the semiconductor device according to the fourteenth preferred embodiment of the present invention. In FIG. 33, the reference numeral 33 designates a dispenser for injecting the resin 31. Other reference numerals designate pats corresponding to those in FIG. 32.

Figure 2:
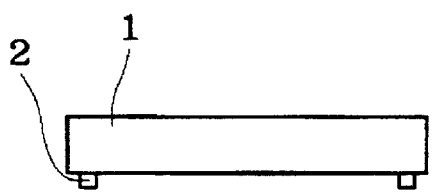
FIGS. 2 through 5 illustrate a method of fabricating the semiconductor device according to the first preferred embodiment of the present invention.

First, the semiconductor device shown in FIG. 32, with the resin 31 dispensed with, is formed in the same manner as in the steps of FIGS. 2 through 4. Referring to FIG. 33, the resin 31 is directed through the through opening 32 by the dispenser 33. The sealing resin 8 is directed from the interior space surrounded by the semiconductor chip 1, the bumps 2, the polyimide tape 6, the lands 5, and the circuit substrate 3 toward the exterior, and is prevented from containing the bubbles 46. Upon completion of the injection of the resin 31, the semiconductor device shown in FIG. 32 is completed.

In the fourteenth preferred embodiment, the resin 31 is directed from the interior of the semiconductor device toward the exterior thereof in the step of sealing the semiconductor device with resin. This suppresses the bubbles 46 contained in the resin 31 and the unfilled portions. Thus, the highly reliable semiconductor device is provided. Further, since the space surrounded by the semiconductor chip 1, the bumps 2, the polyimide tape 6, the lands 5, and the circuit substrate 3 is not completely closed, the conditions of resin viscosity and injection pressure are less limited.

Fifteenth Preferred Embodiment

Figure 34:
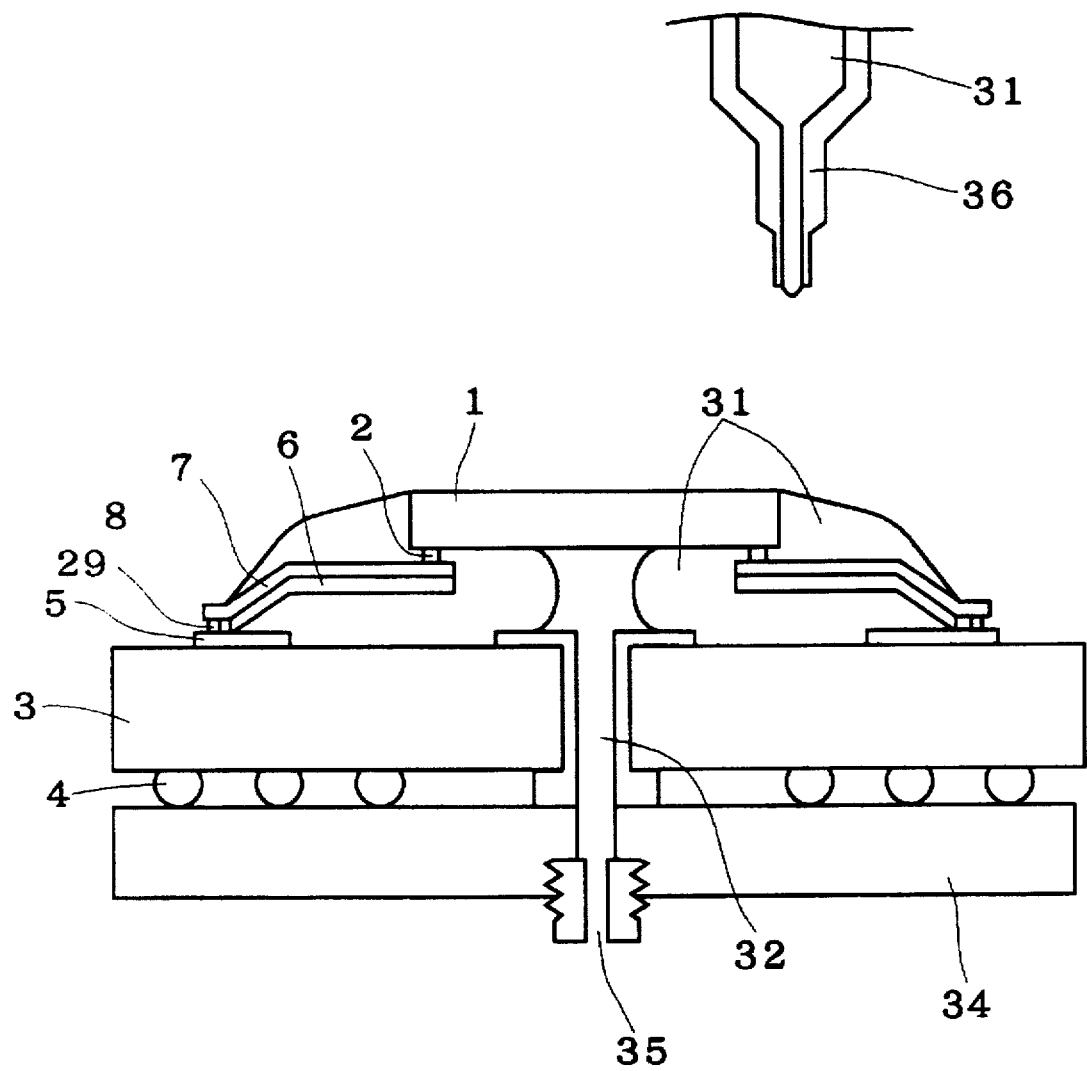
FIG. 34 illustrates the method of fabricating the semiconductor device according to a fifteenth preferred embodiment of the present invention.
Figure 35:
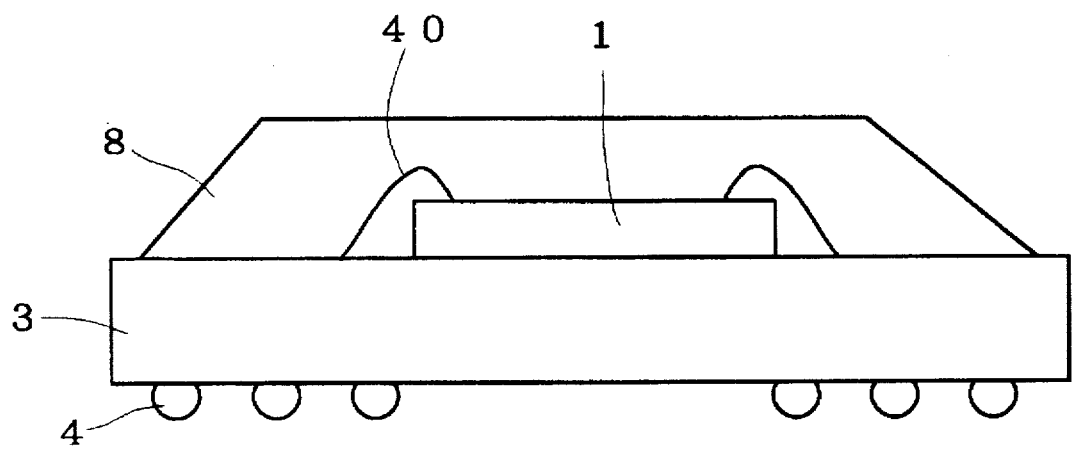
FIG. 35 illustrates a conventional semiconductor device.

FIG. 34 illustrates the method of fabricating the semiconductor device according to a fifteenth preferred embodiment of the present invention. In FIG. 34, the reference numeral 34 designates an exhaust table for placing the semiconductor device thereon; 35 designates a through opening formed in the exhaust table 34; and 36 designates a dispenser for supplying the resin 31 from the exterior of the semiconductor device. Other reference numerals designate parts corresponding to those in FIG. 32.

The method of fabricating the semiconductor device of FIG. 32 is discussed below. First, the semiconductor device shown in FIG. 32, with the resin 31 dispensed with, is provided in the same manner as in the steps shown in FIGS. 2 through 4.

Referring to FIG. 34, the semiconductor device in which the resin 31 is not formed is placed on the exhaust table 34. The through opening 32 communicates with the through opening 35. The resin 31 is fed by the dispenser 36 from above the semiconductor device and is then formed. During the feeding of the resin 31, air is exhausted from the interior to the exterior of the semiconductor device through the through opening 35. Then, the resin 31 covering the outside of the semiconductor device gradually flows into and fills the interior space surrounded by the semiconductor chip 1, the polyimide tape 6, the lands 5, and the circuit substrate 3. Since the interior space of the semiconductor device is evacuated, air which may cause bubbles is removed. Upon completion of the flow of the resin 31 from the exterior to the interior of the semiconductor device, the semiconductor device shown in FIG. 32 is completed.

In the fifteenth preferred embodiment, the resin 31 is directed from the exterior to the interior of the semiconductor device while air is exhausted. This suppresses the bubbles contained in the resin 31 and the unfilled portions. Thus, the highly reliable semiconductor device is provided. Further the resin 31 flows easily.

The thirteenth to fifteenth preferred embodiments are applicable to other preferred embodiments.

While the invention has been described in detail, the foregoing description is in all aspects illustrative and not restrictive. It is understood that numerous other modifications and variations can be devised without departing from the scope of the invention.

We claim:

1. A semiconductor device comprising:
   a chip having at least one first electrode formed on a first chip surface;

a substrate having at least one second electrode formed on a first substrate surface;

at least one tape automated bonding element comprising an insulating member and a continuous conductive flat strip having one end connected to said at least one first electrode and a second end connected to said at least one second electrode to establish a short flat electrical connection portion extending between said at least one first electrode and said at least one second electrode with both strip ends being trimable to fit the continuous conductive strip between the at least one first electrode and the at least one second electrode;

said first chip surface being in face to face relation to said first substrate surface; and said at least one tape automated bonding element continuous flat strip being provided so as to occupy no more than a space between said first chip surface and said first substrate surface needed for clearance for the short flat electrical connection portion.

2. The semiconductor device of claim 1, further comprising:

a heat dissipator having a good heat dissipating property coupled to said chip.

3. The semiconductor device of claim 1, further comprising:

an external electrode formed on a second surface of said substrate in a position removed from a position under the connection between said at least one second electrode and said second end of said continuous conductive flat strip, said external electrode being electrically connected to said at least one second electrode.

4. The semiconductor device of claim 1, further comprising:

a conductive element connected to a ground and mounted adjacent to at least one end of the continuous conductive flat strip to cause the adjacent end to function as a micro strip line.

5. The semiconductor device of claim 1, further comprising:

a signal line formed in said substrate and connected to said at least one second electrode; and a conductive element connected to a ground and mounted adjacent to both the at least one second electrode and the signal line so that said at least one second electrode and said signal line to will function as micro strip lines.

6. The semiconductor device of claim 1, further comprising:

a signal line formed in said substrate and connected to said at least one second electrode; and a conductive element connected to a ground and mounted in a common plane with said at least one second electrode and said signal line so that said at least one second electrode and said signal line will function as coplanar strip lines.

7. The semiconductor device of claim 4, wherein said conductive element is included as a conductive layer of said tape automated bonding element.

8. The semiconductor device of claim 4, wherein said conductive element is formed as a conductive layer on said first substrate surface.

9. The semiconductor device of claim 1, further comprising:

a signal line formed in said substrate or on said first substrate surface and connected to said at least one second electrode; and a conductive layer formed on the first substrate surface between said tape automated bonding element and said signal line, said conductive layer being connected to a ground and causing said at least one second electrode and said signal line to function as micro strip lines or coplanar strip lines.

10. The semiconductor device of claim 1, further comprising:

a cavity formed in said first substrate surface under said chip and excavated from said first substrate surface;

at least one third electrode formed in said cavity; and at least one fourth electrode formed on said first chip surface, said at least one third electrode being electrically connected to said at least one fourth electrode.

11. The semiconductor device of claim 1, further comprising:

at least one third electrode formed on said first substrate surface under said chip;

at least one fourth electrode formed on said first chip surface; and an electrically conductive resin between said at least one third electrode and said at least one fourth electrode for establishing an electrical connection between said at least one third electrode and said at least one fourth electrode.

12. The semiconductor of claim 1, further comprising:

at least one third electrode formed on said first substrate surface under said chip, a second tape automated bonding element including a further conductive portion establishing an electrical connection between an additional first electrode and said at least one third electrode.

13. The semiconductor device of claim 12, wherein said at least one first electrode includes an electrode portion formed outside said chip, wherein said at least one second electrode is formed on said first substrate surface in a position other than a position under said chip, said electrode portion formed outside said chip and said at least one second electrode are electrically connected to each other by said short flat electrical connection portion, wherein said additional first electrode includes an electrode portion formed inside said chip, and said electrode portion formed inside said chip and said at least one third electrode are electrically connected to each other by said second tape automated bonding element further conductive portion.

14. The semiconductor device of claim 1, further comprising:

a resin provided in contact with only said chip and said at least one tape automated bonding element for fixing said chip and said at least one tape automated bonding element together.

15. The semiconductor device of claim 1, further comprising:

a through opening extending from said first substrate surface to a second substrate surface, said through opening being under said chip; and a resin filling at least a space between said first substrate surface and said chip.

16. A semiconductor device comprising:

a substrate having a through opening from a first substrate surface to a reverse substrate surface;

a chip mounted in said through opening and having at least one tape automated bonding element having an insulating portion and a conductive strip portion establishing an electrical connection between at least one first electrode on the chip and at least one second electrode on the first substrate surface; and a system circuit board supporting the substrate with said chip mounted in said through opening contacting the system circuit board through a thermal coupling element.

17. The semiconductor device of claim 16, the thermal coupling element further comprising:

a thermally conductive material or at least one thermally conductive member in contact with at least a portion of a surface of said chip, wherein said at least a portion of the surface of said chip is a portion having a high temperature.

* * * * *